(12) United States Patent
Zheng

(10) Patent No.: US 6,794,245 B2
(45) Date of Patent: Sep. 21, 2004

(54) METHODS OF FABRICATING DOUBLE-SIDED HEMISPHERICAL SILICON GRAIN ELECTRODES AND CAPACITOR MODULES

(75) Inventor: Lingyi A. Zheng, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 10/198,221

(22) Filed: Jul. 18, 2002

(65) Prior Publication Data

US 2004/0014279 A1 Jan. 22, 2004

(51) Int. Cl.$^7$ .......................................... H01L 21/8242
(52) U.S. Cl. ...................... 438/255; 438/253; 438/254; 438/396; 438/397; 438/398
(58) Field of Search ................ 438/253–256, 438/396–399; 257/303–309

(56) References Cited

U.S. PATENT DOCUMENTS

| | | | | |
|---|---|---|---|---|
| 5,817,555 A | * | 10/1998 | Cho | 438/253 |
| 5,937,294 A | * | 8/1999 | Sandhu et al. | 438/255 |
| 5,945,350 A | * | 8/1999 | Violette et al. | 438/706 |
| 6,046,083 A | * | 4/2000 | Lin et al. | 438/255 |
| 6,066,529 A | * | 5/2000 | Lin et al. | 438/255 |
| 6,159,818 A | | 12/2000 | Durcan et al. | 438/387 |
| 6,207,497 B1 | * | 3/2001 | Huang et al. | 438/253 |
| 6,221,730 B1 | * | 4/2001 | Honma | 438/398 |
| 6,228,711 B1 | * | 5/2001 | Hsieh | 438/255 |
| 6,258,691 B1 | * | 7/2001 | Kim | 438/398 |
| 6,319,789 B1 | | 11/2001 | Carstensen | 438/396 |
| 6,329,263 B1 | | 12/2001 | Durcan et al. | 438/387 |
| 6,333,240 B1 | | 12/2001 | Durcan et al. | 438/396 |

* cited by examiner

*Primary Examiner*—John F. Niebling
*Assistant Examiner*—Jennifer M. Kennedy
(74) *Attorney, Agent, or Firm*—Schwegman, Lundberg, Woessner & Kluth, P.A.

(57) ABSTRACT

The invention provides robust and cost effective techniques to fabricate double-sided HSG electrodes for container capacitors. In one embodiment, this is accomplished by forming a layer of hemispherical silicon grain (HSG) polysilicon over interior surfaces of a container formed in a substrate. A barrier layer is then formed over the formed HSG polysilicon layer. Any HSG polysilicon and barrier layers formed over the substrate and around the container opening during the forming of the HSG polysilicon and barrier layers is then removed. A portion of outside surfaces of the formed HSG polysilicon is then exposed by removing the substrate, while the barrier layer is still on the interior surface of the container to prevent formation of sink holes and to prevent stringer problems during removal of the substrate. The barrier layer is then removed to expose the interior surfaces of the HSG polysilicon to form the double-sided HSG electrode.

53 Claims, 11 Drawing Sheets

METHODS OF FABRICATING DOUBLE-SIDED HEMISPHERICAL SILICON GRAIN ELECTRODES AND CAPACITOR MODULES

FIELD OF THE INVENTION

The present invention relates to semiconductor fabrication and, in particular, to fabrication of container capacitors for dense semiconductor memory arrays.

BACKGROUND OF THE INVENTION

Continuing advances in miniaturization and densification of integrated circuits have led to smaller areas available for devices such as transistors and capacitors. For example, in semiconductor manufacturing of a memory array for a dynamic random access memory (DRAM), each memory cell comprises a capacitor and a transistor. With shrinkage of the cell size, maintaining a sufficient amount of cell charge storage capacitance becomes a challenge in DRAM.

To increase capacitance, the semiconductor industry has moved from planar capacitor structures (e.g., "parallel plate capacitors") to vertical capacitor structures known as "container capacitors". Several techniques have been developed to fabricate such capacitors. One such technique includes fabricating a cup-shaped bottom electrode defining an interior surface and an exterior surface formed on a substrate. A recess between adjacent bottom electrodes is formed in the insulating layer to expose a portion of the electrodes' exterior surfaces. A capacitor dielectric and then a top electrode are deposited over the interior of the cup-shaped bottom electrode and the interior of the recess. Such a double-sided bottom electrode provides additional capacitance.

Conventionally, the bottom electrode of the double-sided electrode is formed of N-type hemispherical silicon grain (HSG). Using a double-sided HSG bottom electrode provides a higher surface area for increased capacitance. Current techniques to form the double-sided HSG bottom electrode include a selective HSG process and a combo HSG process. The selective HSG process requires selectively growing the HSG on the interior container surface and this results in an outside smooth and inside rough HSG electrode.

Poor selectivity of HSG growth results in HSG outgrowth on the exterior electrode surface, and this can cause cell-to-cell shorts, requiring the space between containers to be enlarged. The combo HSG process requires etching back the substrate using a hydrofluoric acid (HF) solution to expose a portion of the bottom electrodes outer surface. However, while etching back the substrate using the HF solution any pinholes present in the bottom electrode can cause locally preferential overetch and generate sinkholes and stringer problems in the substrate material. Further, the cell dielectric leakage increases due to the formation of high electric fields around sharp points due to a higher surface roughness of the HSG formed on the interior surface of the container. This results in a lower capacitance in the cell. Furthermore, current process flow to form the dual-sided HSG container exposes the formed HSG electrodes on a wafer surface to HSG floaters falling on the wafer and conductive surface defects that can cause cell-to-cell short.

Thus, there is a need in the art for a technique to form double-sided HSG electrodes that overcomes the above-described problems.

SUMMARY OF THE INVENTION

The present invention provides techniques for fabricating double-sided HSG electrodes for container capacitors that are more robust, less complex, and cost effective.

In one aspect, the invention provides methods for forming a double-sided HSG electrode. In one embodiment of the methods, the bottom electrode is fabricated by forming a layer of hemispherical silicon grain (HSG) polysilicon over interior surfaces of a container formed in a substrate. A barrier layer is then formed over the formed HSG polysilicon layer. Any HSG polysilicon and barrier layers formed outside and around the container opening during the formation of the HSG polysilicon and barrier layers is then removed to expose the substrate. A portion of outside surfaces of the formed HSG polysilicon is then exposed by removing the substrate, while the barrier layer is still on the interior surface of the container to prevent formation of sink holes and to prevent stringer problems during removal of the substrate. The barrier layer is then removed to expose the interior surfaces of the HSG polysilicon to form the double-sided HSG electrode.

In another aspect, the invention provides methods for forming an unsymmetrical cell nitride layer on a double-sided container electrode to improve cell capacitance and leakage performance. In one embodiment of the methods, a barrier layer over interior surfaces of a container is formed in a substrate. A bottom electrode is then fabricated by forming a layer of HSG polysilicon over the formed barrier layer such that the formed bottom electrode has a roughened interior surface and a smooth exterior surface. Any HSG polysilicon and barrier layers formed outside and around the container opening during the formation of the HSG polysilicon and barrier layers is then removed to expose the substrate. A portion of the barrier layer is then exposed by removing the substrate. A layer of nitride is then formed over the interior surface of the formed HSG polysilicon. The outside surface of the HSG polysilicon is then exposed by removing the exposed portion of the barrier layer. The formed nitride layer and the exposed outside surface of the HSG polysilicon is then pre-cleaned and a layer of cell nitrides deposited over the pre-cleaned surfaces. A top electrode is then formed over the deposited cell nitride layer to form the double-sided container electrode including unsymmetrical cell nitride layers.

In another aspect, the invention provides methods for forming a double-sided container electrode that reduces cell-to-cell shortage during process flow when the electrodes are on a wafer and exposed to process defects. In one embodiment of the methods, a bottom electrode is fabricated by forming a smooth polysilicon layer over interior surfaces of a container formed in a substrate. Any HSG polysilicon layer formed outside and around the container opening during the formation of the HSG polysilicon and barrier layers is then removed to expose the substrate. A portion of the substrate is then removed to expose the outside surface of the formed smooth polysilicon layer. A nitride layer is then deposited over the interior and exposed exterior surfaces of the smooth polysilicon layer. A barrier layer is then deposited over the nitride layer such that the barrier layer fills within and around the container. A recess is then formed to expose a top portion of the container by removing the barrier and nitride layers. Remaining barrier layer is then removed to expose the nitride layer. The exposed top portion of the smooth polysilicon is then oxidized to form an oxide on the top of the container. Remaining nitride layer is then removed to expose the smooth polysilicon surface of the container. A HSG polysilicon layer is then formed on the interior surfaces of the smooth polysilicon layer to form the dual-sided container electrode.

In another aspect, the invention provides methods for forming a double-sided container electrode that reduces cell-to-cell shortage during process flow when the electrodes are on a wafer and exposed to process defects. In one embodiment of the methods, a bottom electrode is fabricated by forming a smooth polysilicon layer over interior surfaces of a container formed in a substrate. Any HSG polysilicon layer formed outside and around the container opening during the formation of the HSG polysilicon and barrier layers is then removed to expose the substrate. A portion of the substrate is then removed to expose the outside surface of the formed smooth polysilicon layer. A barrier layer is then deposited over the dual-sided smooth polysilicon layer such that the barrier layer surrounds and fills the container. A portion of the formed barrier layer is then removed to form a recess such that the formed recess exposes a top potion of the formed dual-sided smooth polysilicon layer. The exposed top portion of the dual-sided smooth polysilicon layer is then nitridized to form a nitride cap. The remaining barrier layer is then removed to expose the polysilicon layer of the dual-sided bottom electrode. A HSG polysilicon layer is then formed over the interior surfaces of the smooth polysilicon layer within the container.

In another aspect, the invention provides a double-sided HSG electrode. In one embodiment, the double-sided HSG electrode includes a cup-shaped bottom electrode defining an interior surface and an exterior surface within a container formed in an insulative layer. The interior surface of the container comprises a HSG polysilicon layer and the exterior surface comprises a smooth polysilicon layer. A first dielectric layer overlies the interior surface of the lower electrode. A second dielectric layer overlies the first dielectric layer and the outer surface of the electrode, and a top electrode overlies the second dielectric layer.

In another aspect, the invention provides a double-sided HSG electrode. In one embodiment, the double-sided HSG electrode includes a cup-shaped bottom electrode defining an interior surface and an exterior surface within a container formed in an insulative layer. The interior surface of the container comprises a HSG polysilicon layer and the exterior surface comprises a smooth polysilicon layer. A top portion of the cup-shaped bottom electrode comprises an oxidized silicon cap to prevent cell-to-cell short. A dielectric layer overlies the lower electrode, and a top electrode comprising a conductive layer overlies the dielectric layer.

In yet another aspect, the invention provides a double-sided HSG electrode. In one embodiment, the double-sided HSG electrode includes a cup-shaped bottom electrode defining an interior surface and an exterior surface within a container formed in an insulative layer. The interior surface of the container comprises a HSG polysilicon layer and the exterior surface comprises a smooth polysilicon layer. A top portion of the cup-shaped bottom electrode comprises a nitride cap to prevent cell-to-cell short. A dielectric layer overlies the lower electrode, and a top electrode comprising a conductive layer overlies the dielectric layer.

Additional advantages and features of the present invention will be more apparent from the detailed description and accompanying drawings, which illustrate preferred embodiments of the invention.

DETAILED DESCRIPTION OF THE INVENTION

In the following detailed description, reference is made to various specific embodiments in which the invention may be practiced. These embodiments are described with sufficient detail to enable those skilled in the art to practice the invention, and it is to be understood that other embodiments may be employed, and that structural, logical, electrical, and process changes may be made without departing from the teachings of the invention.

In the foregoing description of the preferred embodiments, various features of the invention are grouped together in a single embodiment for the purpose of streamlining the disclosure. This method of disclosure is not to be interpreted as reflecting an intention that the claimed invention requires more features than are expressly recited in each claim. Rather, as the following claims reflect, inventive aspects lie in less than all features of a single disclosed embodiment. Thus, the following claims are hereby incorporated into the description of the preferred embodiments, with each claim standing on its own as a separate preferred embodiment of the invention.

The term 'substrate' used in the following description may include materials, such as silicon, silicon-on insulator (SOI), silicon-on sapphire (SOS), doped and undoped semiconductors, epitaxial layers of silicon supported by a base semiconductor foundation, and other semiconductor structures. The semiconductor need not be silicon-based. The semiconductor could be silicon-germanium, germanium, or gallium arsenide. When reference is made to a wafer or substrate in the following description, previous process steps may be utilized to form regions, junctions, or layers in or on the base semiconductor or foundation.

The terms "semiconductive wafer fragment" or "wafer fragment" or "wafer" will be understood to mean any construction comprising semiconductor material, including but not limited to bulk semiconductive materials such as a semiconductor wafer (either alone or in assemblies comprising other material thereon), and semiconductive material layers (either alone or in assemblies comprising other materials).

The present invention provides techniques for fabricating a memory array including container capacitors formed using double-sided HSG electrodes that are more robust, less complex, and more cost effective. In some embodiments, the formed memory cell array can be a flash memory cell array, a memory circuit including an array of memory cells disposed on a substrate and/or a logic circuit including an array of memory cells.

Double-Sided Combo HSG Electrode

An embodiment of a method of the present invention is described using FIGS. 1–7 to form a container capacitor including a double-sided HSG bottom electrode.

Figure 1:
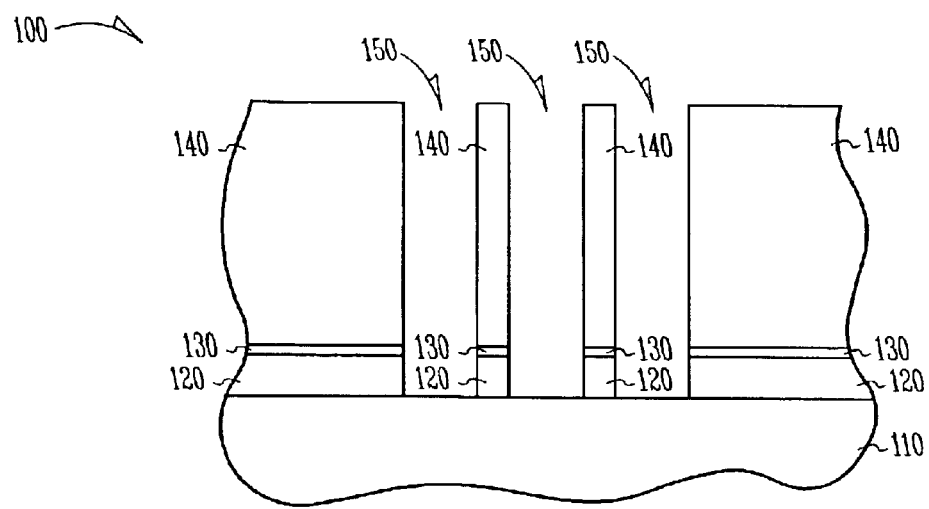
FIGS. 1–7 are cross sectional views of a wafer fragment that illustrate sequential fabrication operations of an embodiment of the present invention.

Referring now to FIG. 1, a portion of a semiconductor wafer 100 is shown at a preliminary processing step. The wafer fragment 100 in progress can include a semiconductor wafer substrate or the wafer along with various process layers formed thereon, including one or more semiconductor layers or other formations, and active or operable portions of semiconductor devices.

The wafer fragment 100 is shown including a substrate 110, a first overlying insulative layer 120, a wet etch stop layer 130, and a second overlying insulative layer 140. The substrate can include semiconductor-based materials, such as silicon-on insulator (SOI), silicon-on sapphire (SOS), doped and undoped semiconductors, epitaxial layers of silicon supported by a base semiconductor foundation, and/or other semiconductor-based materials. The semiconductor-based materials can also include materials, such as silicon-germanium, germanium, and/or gallium arsenide. Insulative layers 120 and 140 can include materials, such as silicon dioxide ($SiO_2$), phosphosilicate glass (PSG), borosilicate glass (BSG), and borophosphosilicate glass (BPSG). The insulative materials 120 and 140 in this example embodiment being BPSG.

Also shown in FIG. 1, are multiple containers or openings 150 that have been formed by conventional dry etching through the first and second BPSG insulative layers 120, 140 and the wet etch stop layer 130 to an active region in the substrate 110. Chemicals such as, $CF_4$, $C_4F_6$, and other such chemicals can be used in the conventional dry etch process to form the containers 150. For simplicity and a better understanding of a memory cell structure, only a few containers 150 are shown in FIG. 1. It can be envisioned that the substrate can include an array of memory cells including similar containers.

The wet etch stop layer 130 is conformally deposited over the first insulative layer 120, has a characteristic etch rate in which etchants will selectively remove the second insulative layer 140 in a later operation without significantly etching the etch stop layer 130. The wet etch stop layer 130 can include, for example, silicon nitride ($SiN_x$) at about 100 to 200 Å, or $SiO_2$ formed by decomposition of a tetraethylorthosilicate (TEOS) precursor in the range of about 500 to 1000 Å.

Figure 2:
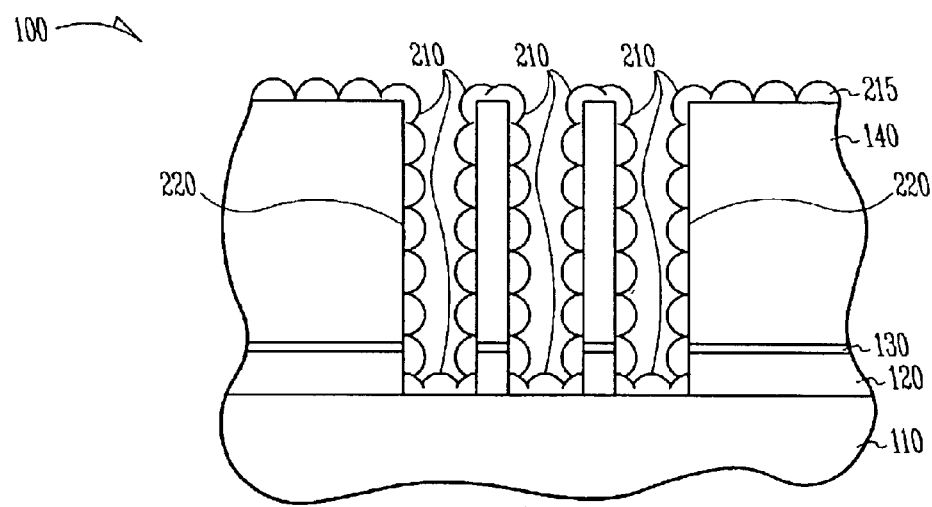

Referring now to FIG. 2, a bottom electrode is formed by depositing a layer of hemispherical silicon grain (HSG) polysilicon 210 and 215 using a combo HSG process within each of the openings and over interior surfaces of the containers 150, and outside and around container openings, respectively, to form a cup-shaped structure for the bottom electrode within the openings.

HSG layer 210 formation is well known in this art and many different known processes may be used in conjunction with the present invention. The example embodiment of forming the HSG layer disclosed in the present invention comprises depositing a layer of an amorphous doped and undoped bilayer silicon within each of the openings or over interior surfaces of the containers to form a cup-shaped structure for the bottom electrode within the openings. Then, crystalline poly seeds are deposited on top of the deposited layer of doped and undoped amorphous bilayer silicon. Then, the cup-shaped structures including the layers of polysilicon and poly seeds are annealed to grow the HSG from the crystalline seeds through silicon diffusion. The thickness of the bottom electrode layer formed using HSG can be in the range of about 350 to 500 Å. The formed HSG layer 210 has a smooth exterior surface 220 and a rough interior surface 210.

In some embodiments, the cup shaped structure has cross-sectional shapes, such as circular, square, rectangular, trapezoidal, triangular, oval, and/or rhomboidal, among other such shapes with respect to the top down view of the cross-sections of the bottom electrodes.

Figure 3:
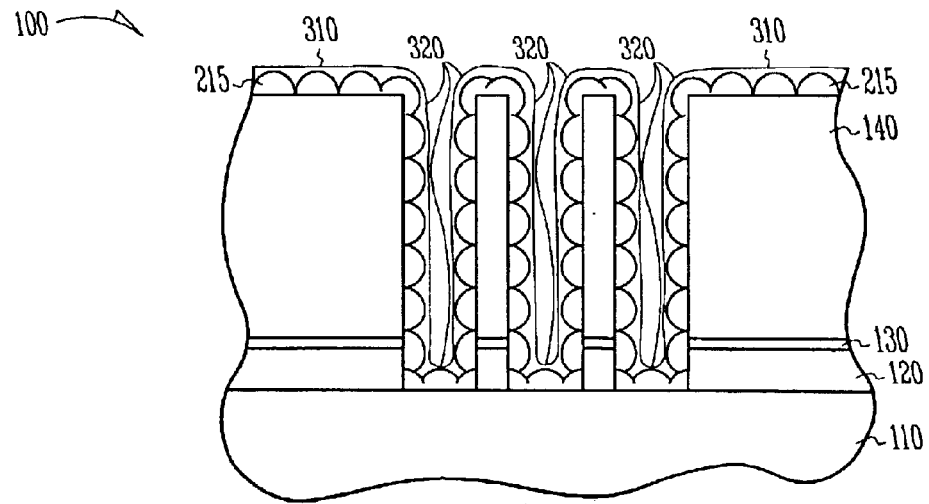

FIG. 3 illustrates forming a thin barrier layer 310 and 320 over the formed HSG layers 215 and 210, respectively. The barrier layer is formed using a titanium nitride (TiN) layer in the embodiment shown in FIG. 3. A TiN layer barrier layer 310 and 320 can be formed by a convention thermal chemical vapor deposition (TCVD), plasma enhanced CVD (PECVD), or atomic layer deposition (ALD), utilizing a source gas comprising precursors of tetrakisdimethylamidotitanium (TDMAT)(($(CH_3)_2N)_4$Ti)and ammonia ($NH_3$), or titanium tetrachloride ($TiCl_4$) and $NH_3$. The thickness of the TiN barrier layer 310 can be in the range of about 100 to 200 Å. The TiN barrier layer 310 is only used as an etch back protective layer for the HSG layer 210 during a later removal of the second BPSG insulative layer 140 to prevent formation of sink holes and stringer problems. Therefore, the conformity of the TiN barrier layer 310 is not critical, that is, the TiN barrier layer 310 need not follow the surface contours of the formed HSG layer 210 for this application, because the TiN barrier layer will be stripped in a later process. In addition, the formed TiN barrier layer 310 is only being used to prevent the formation of sink holes and stringer problems during the BPSG etch back process to form the double-sided HSG electrode.

Figure 4:
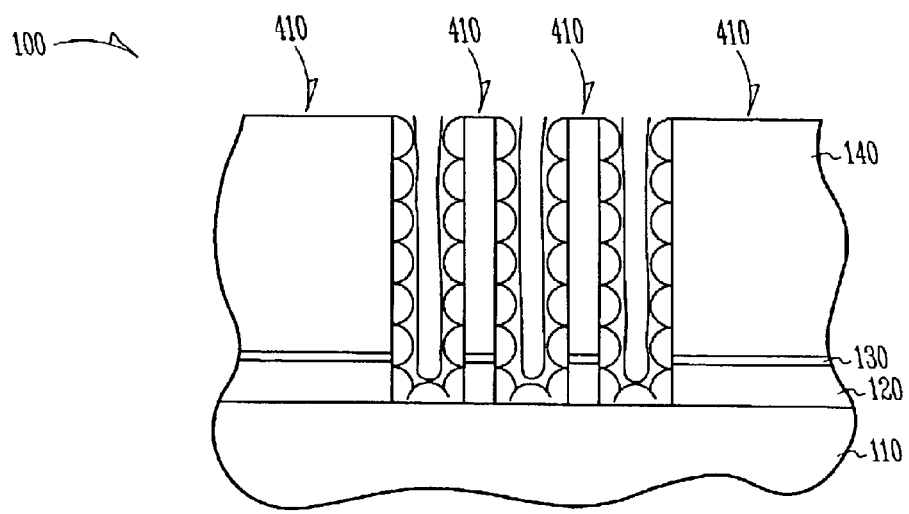

Referring now to FIGS. 3 and 4, the TiN barrier layer 310 and the HSG polysilicon layer 215 overlying the second BPSG insulative layer 140 and outside and around the container openings, are subjected to a conventional dry etch or chemical mechanical polishing (CMP) 410 to expose the upper surface of the second BPSG insulative layer 140. A suitable dry etch comprises exposing the wafer fragment 100 to $CF_4$, $C_4F_6$, among others, at a temperature range of about 25° C. to 150° C., a pressure of about 30 to 100 mTorr, and a gas flow rate of about 30 to 100 sccm.

Figure 5:
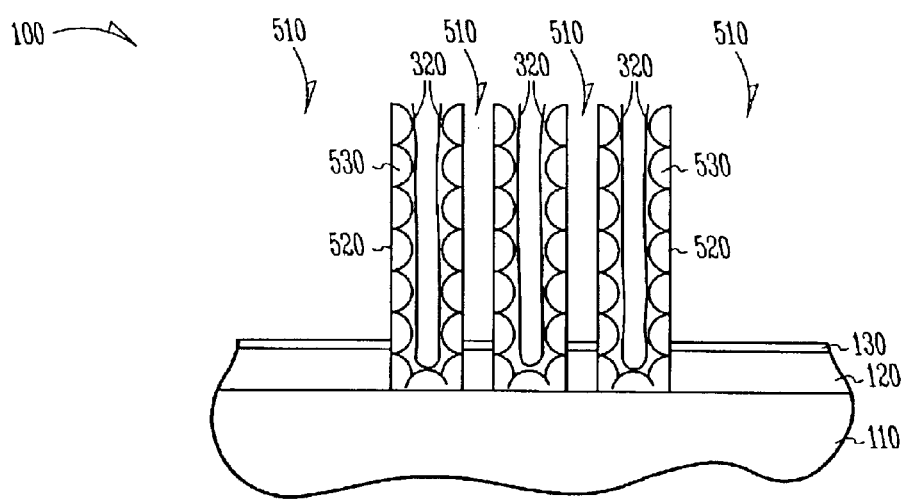

As depicted in FIG. 5, the second BPSG insulative layer 140 is removed by wet etch 510 using a hydrofluoric acid (HF) solution to form an opening or recess to expose the exterior surfaces 520 of the HSG electrodes 530, resulting in cup-shaped bottom electrode structures. As shown, the insulative layer 140 has been downwardly etched to expose the nitride etch stop layer 130. The HF wet etch is selective to the TiN layer 320 shown in FIG. 3 and the HSG polysilicon layer 210 shown in FIG. 2. In some embodiments, the HF solution comprises a 10:1 HF solution. For about 17,000 Å of BPSG insulative layer the etching can comprise the use of a 10:1 HF solution for about 345 seconds.

Figure 6:
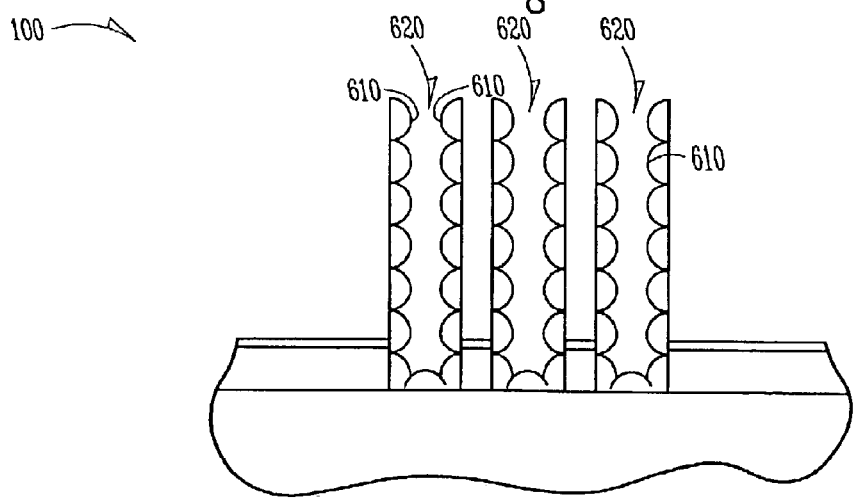

Referring to FIGS. 5 and 6, the TiN barrier layer 320 is then stripped from the interior surfaces 610 of the HSG electrode 530 using a conventional piranha wet etch 620, for example, by immersing the wafer 110 in a solution of sulfuric acid ($H_2SO_4$) and an oxidant such a hydrogen peroxide ($H_2O_2$).

Figure 7:
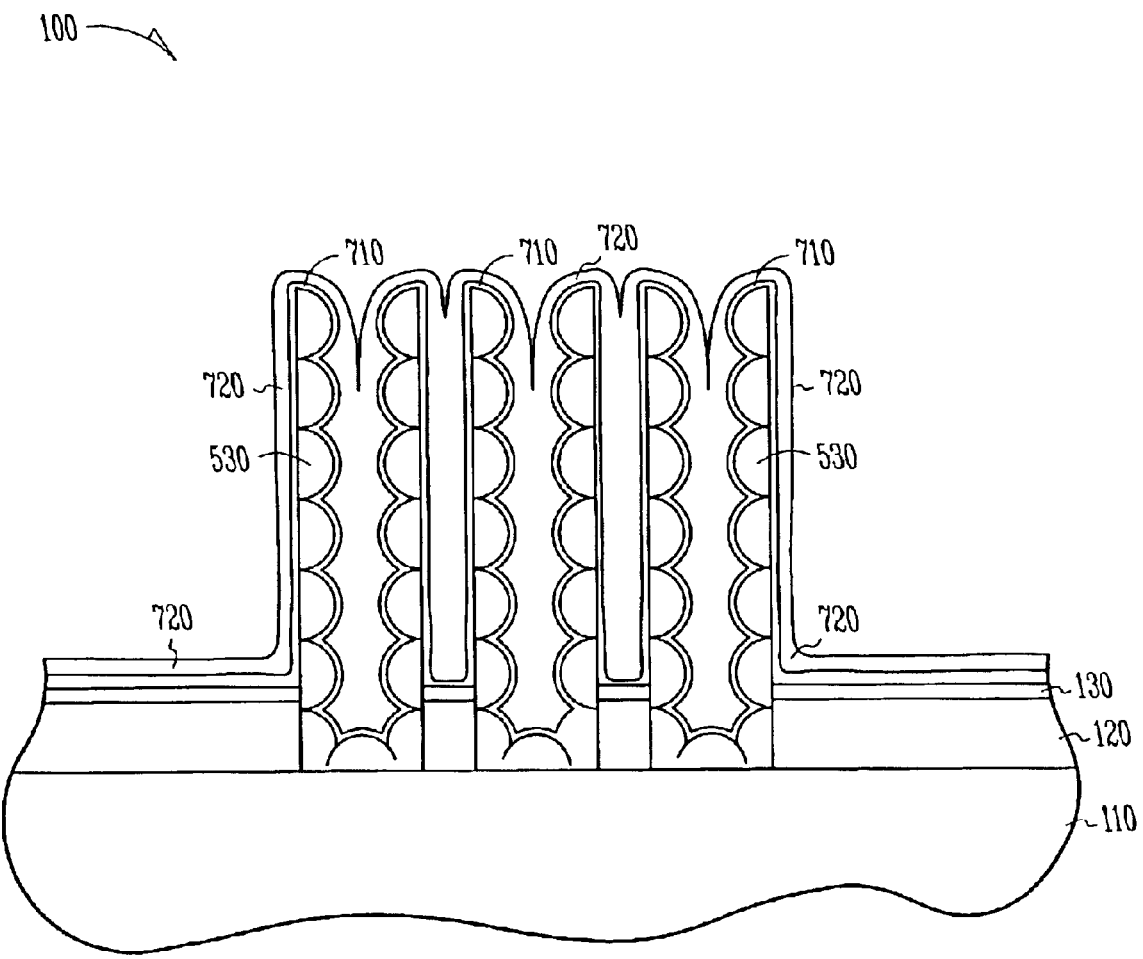

Referring to FIG. 7, a cell nitride layer 710 comprising silicon nitride ($SiN_x$) can be conformally deposited over the HSG polysilicon electrode 530, typically by low pressure chemical vapor deposition (LPCVD) of a silicon source gas such as $SiH_2Cl_2$, $SiCl_4$, $SiH_4$, and $Si_2H_6$ and a nitrogen source gas such as $NH_3$. Conventional silicon nitride deposition processes other than LPVCD can also be used, including physical deposition, plasma enhanced chemical vapor deposition, and rapid thermal chemical vapor deposition, among others.

A conductive material can then be deposited over the cell nitride layer 710 to form the top capacitor electrode 720. The top electrode 720 can comprise a conductive material such as doped polysilicon or a conductive metal. The conductive material can be deposited on the cell nitride layer 710, by conventional methods, such as chemical vapor deposition (CVD), or physical vapor deposition (e.g., sputtering) for a metal plate to complete the container capacitor structure including a double-sided HSG electrode.

Double-Sided HSG Electrode with Unsymmetrical Cell Dielectric

Another embodiment of a method of the present invention is described using FIGS. 8–13 to form a container capacitor including an unsymmetrical cell nitride on a double-sided HSG bottom electrode.

Figure 8:
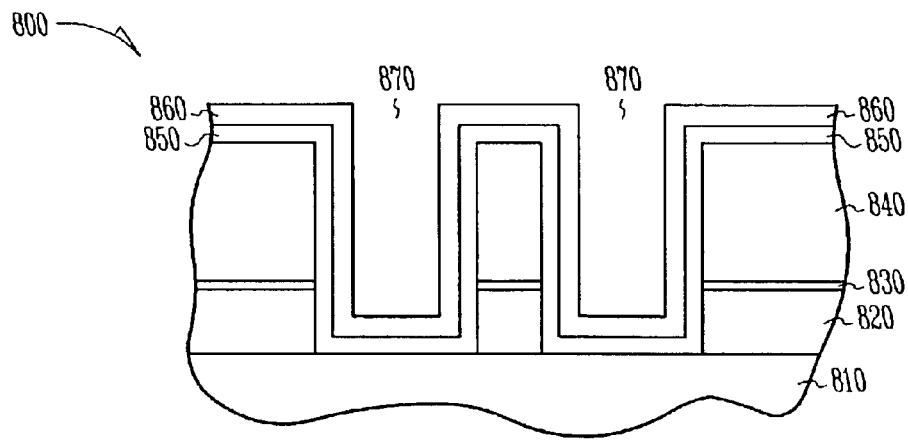
FIGS. 8–13 are cross-sectional views of a wafer fragment that illustrate sequential fabrication operations of another embodiment of the present invention.

Referring now to FIG. 8, a portion of a semiconductor wafer 800 is shown at a preliminary processing step. The wafer fragment 800 in progress can include a semiconductor wafer substrate or the wafer along with various process layers formed thereon, including one or more semiconductor layers or other formations, and active or operable portions of semiconductor devices.

The wafer fragment 800 is shown including a substrate 810, a first overlying insulative layer 820, a wet etch stop layer 830, and a second overlying insulative layer 840. The substrate can include semiconductor-based materials, such as silicon-on insulator (SOI), silicon-on sapphire (SOS), doped and undoped semiconductors, epitaxial layers of silicon supported by a base semiconductor foundation, and/ or other semiconductor-based materials. The semiconductor-based materials can also include materials, such as silicon-germanium, germanium, and/or gallium arsenide. Insulative layers 820 and 840 can include materials, such as silicon dioxide ($SiO_2$), phosphosilicate glass (PSG), borosilicate glass (BSG), and borophosphosilicate glass (BPSG).

Also shown in FIG. 8 are multiple containers or openings 870 that have been formed by conventional dry etching through the first and second BPSG insulative layers 820, 840 and the wet etch stop layer 830 to an active region in the substrate 810. Chemicals such as, $CF_4$, $C_4F_6$, and other such chemicals can be used in the conventional dry etch process to form the containers 870. For simplicity and a better understanding of a memory cell structure, only a few containers 870 are shown in FIG. 8. It can be envisioned that the substrate can include an array of memory cells including similar containers.

The wet etch stop layer 830 is conformally deposited over the first insulative layer 820, has a characteristic etch rate in which etchants will selectively remove the second insulative layer 840 in a later operation without significantly etching the etch stop layer 830. The wet etch stop layer 830 can include, for example, silicon nitride ($SiN_x$) at about 100 to 200 Å, or $SiO_2$ formed by decomposition of a tetraethylorthosilicate (TEOS) precursor in the range of about 500 to 1000 Å.

Also shown in FIG. 8, is a barrier layer 850 conformally deposited over the second BPSG insulative layer and within each of the openings and over interior surfaces of the containers 870 to form a cup-shaped structure within the openings. The barrier layer 850 is formed using a titanium nitride (TiN) layer in the embodiment shown in FIG. 8. A TiN layer barrier layer 850 can be formed by a convention thermal chemical vapor deposition (TCVD), plasma enhanced CVD (PECVD), or atomic layer deposition (ALD), utilizing a source gas comprising precursors of tetrakisdimethyl-amidotitanium (TDMAT)($((CH_3)_2N)_4Ti$) and ammonia ($NH_3$), or titanium tetrachloride ($TiCl_4$) and $NH_3$. The thickness of the TiN barrier layer 850 can be in the range of about 50 to 100 Å. In addition, FIG. 8 also shows a smooth polysilicon layer 860 conformally deposited over the barrier layer.

Figure 9:
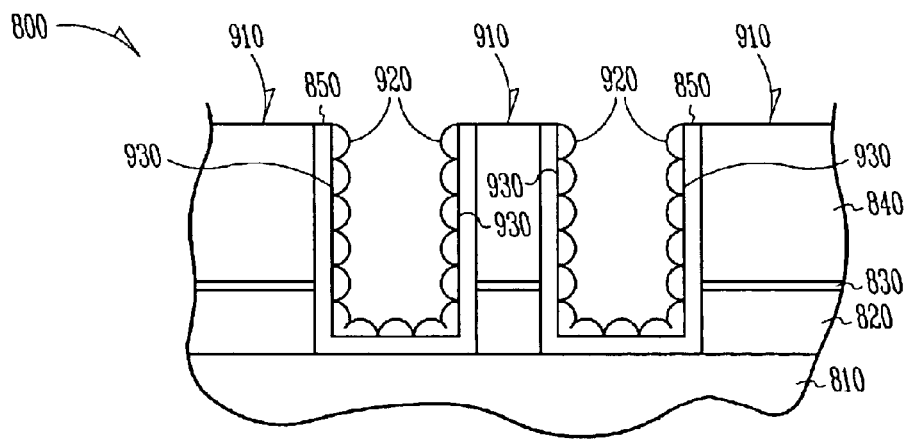

Referring now to FIGS. 8 and 9, the TiN barrier layer 850 and the smooth polysilicon layer 860 overlying the second BPSG insulative layer 840 and outside and around the container openings, are subjected to a conventional dry etch or chemical mechanical polishing (CMP) 910 to expose the upper surface of the second BPSG insulative layer 840. A suitable dry etch comprises exposing the wafer 810 to $CF_4$, $C_4F_6$, among others, at a temperature range of about 25° C. to 150° C., a pressure of about 30 to 100 mTorr, and a gas flow rate of about 30 to 100 sccm.

Also as shown in FIGS. 8 and 9 a bottom electrode is formed using a combo hemispherical silicon grain (HSG) process on the deposited layer of polysilicon 860 within each of the openings or over interior surfaces of the containers 870 to form a cup-shaped structure for the bottom electrode within the openings.

HSG polysilicon layer formation is well known in this art and many different known processes may be used in conjunction with the present invention. The example embodiment of forming the HSG polysilicon layer disclosed in the present invention comprises depositing a layer of an amorphous doped and undoped bilayer silicon within each of the openings or over interior surfaces of the containers to form a cup-shaped structure for the bottom electrode within the openings. Then, crystalline poly seeds are deposited on top of the deposited layer of amorphous doped and undoped bilayer silicon. Then, the cup-shaped structures including the layers of polysilicon and poly seeds are annealed to grow the HSG polysilicon from the crystalline seeds through silicon diffusion. The thickness of the bottom electrode layer formed using HSG polysilicon can be in the range of about 350 to 500 Å. The formed HSG polysilicon layer has a smooth exterior surface 930 and a rough interior surface 920.

In some embodiments, the cup shaped structure has cross-sectional shapes, such as circular, square, rectangular, trapezoidal, triangular, oval, and/or rhomboidal, among other such shapes with respect to the top down view of the cross-sections of the bottom electrodes.

Figure 10:
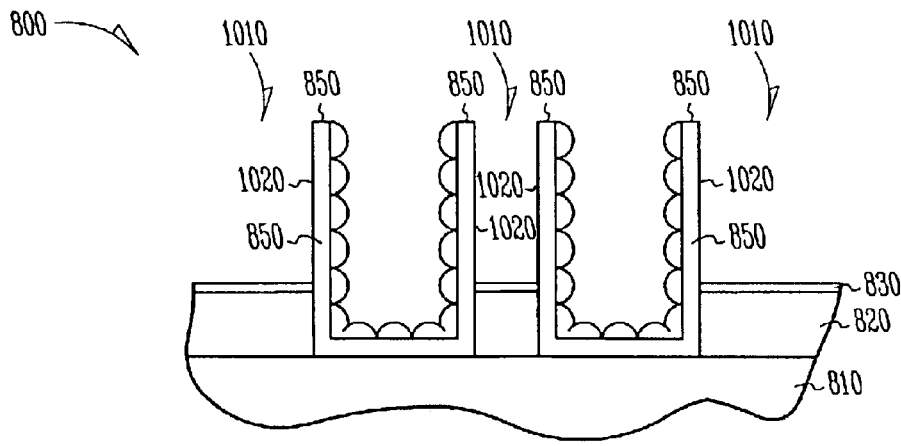

As depicted in FIG. 10, the second BPSG insulative layer 840 is removed by using wet etch 1010 including hydrofluoric acid (HF) solution to form an opening or recess to expose the exterior surfaces 1020 of the TiN layer 850, resulting in cup-shaped bottom electrode structures. As shown, the insulative layer 840 has been downwardly etched to expose the nitride etch stop layer 830. The HF wet etch is selective to the TiN layer 850 and the HSG polysilicon layer 860. In some embodiments, the HF solution comprises a 10:1 HF solution. For an approximately 17,000 Å of BPSG insulative layer, the etching can comprise the use of a 10:1 HF solution for about 345 seconds.

Figure 11:
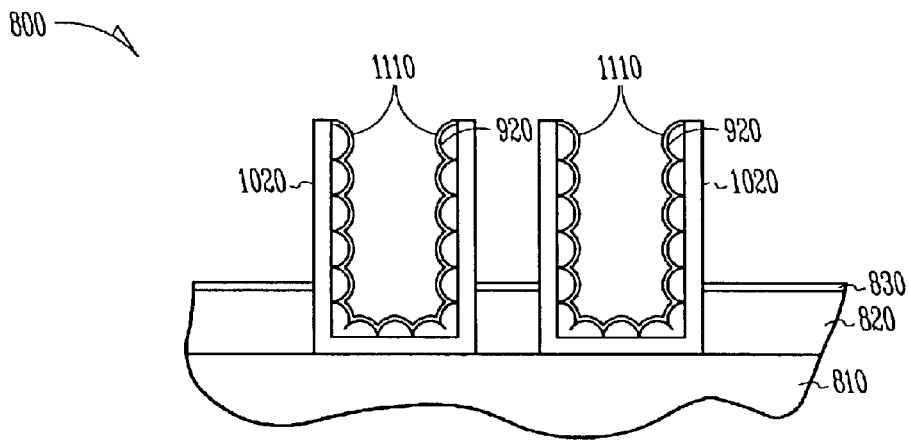

Referring now to FIG. 11, a nitridation layer 1110 is formed on the rough interior surfaces 920 of HSG polysilicon layer 860 by exposing the rough interior surfaces 920 to a nitrogen-containing gas to form an overlying passivating layer comprising silicon nitride ($SiN_x$). The nitridizing process can be performed by remote plasma nitridation (RPN) or decoupled plasma nitridization (DPN) over a temperature range of about 400° C. to 550° C. Nitrogen-containing gases can be gases such as nitrogen ($N_2$) and ammonia ($NH_3$). The thickness of the nitridation layer 1110 can be in the range of about 10 to 25 Å.

Figure 12:
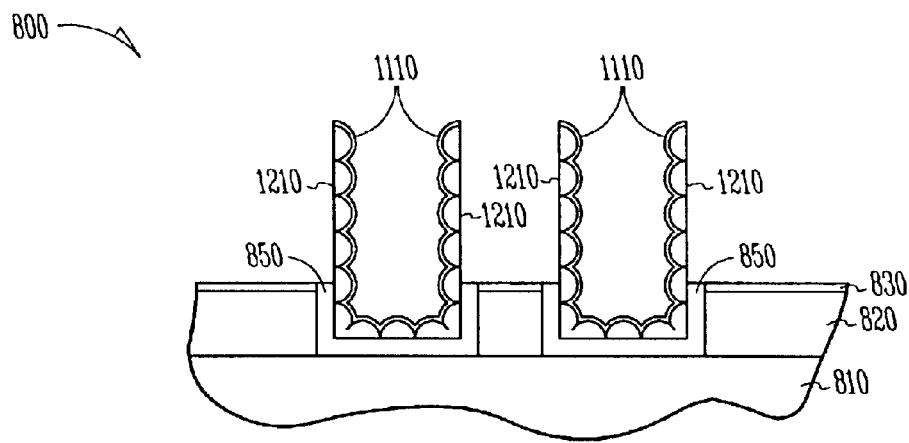

Referring to FIG. 12, a portion of the TiN barrier layer 850 is then stripped from the smooth exterior surfaces 930 of the HSG electrode using a conventional piranha wet etch 1210, for example, by immersing the wafer 800 in a solution of sulfuric acid ($H_2SO_4$) and an oxidant, such as hydrogen peroxide ($H_2O_2$).

Figure 13:
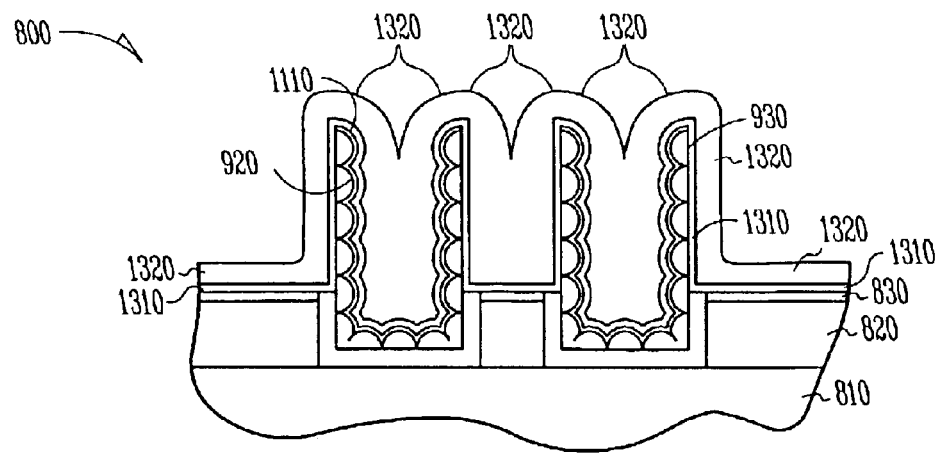

Referring to FIGS. 8 and 13, a cell nitride layer 1310 comprising silicon nitride ($SiN_x$) can be conformally deposited over the roughened interior surface 920 and the smooth exterior surface 930 of the HSG polysilicon electrode 860, typically by low pressure chemical vapor deposition (LPCVD) of a silicon source gas such as $SiH_2Cl_2$, $SiCl_4$, $SiH_4$, and $Si_2H_6$ and a nitrogen source gas such as $NH_3$. Conventional silicon nitride deposition processes other than LPVCD can also be used, including physical deposition, plasma enhanced chemical vapor deposition, and rapid thermal chemical vapor deposition, among others. The thickness of the deposited cell nitride layer 1310 can be in the range of about 45 to 50 Å.

After depositing the cell nitride layer 1310, there is a thickness difference of about 5–10 Å between the cell nitride layer 1310 deposited over the smooth exterior surface 930 of the polysilicon 860 and the cell nitride layer 1310 deposited on the roughened interior surface 920 of the HSG polysilicon layer. This is because the thickness of the cell nitride layer 1310 over the roughened interior surface 930 is about 50–65 Å, whereas the thickness of the cell nitride layer 1310 over the smooth exterior surface 920 is about 45–50 Å. The cell nitride layer 1310 on the roughened interior surface 920 is thicker than the cell nitride layer on the smooth exterior surface 930 because of the additional nitridation layer 1110 deposited on the roughened interior surface 920 of the HSG polysilicon layer as described in detail with reference to FIG. 11.

It is generally known that dielectric leakage increases with increased roughness on an electrode surface. This is due to the formation of local high electrical fields at sharp ridges that exist on a rougher surface. Therefore, having a thicker cell dielectric layer on the roughened interior surfaces 920 of the container 870 reduces the dielectric leakage and increases the cell capacitance by about 1–2 fF per cell electrode.

In some embodiments, the nitridation layer 1110 and the exposed smooth polysilicon surfaces 930 are pre-cleaned before depositing the cell nitride layer 1310 to remove any native oxides formed on the nitridation layer and smooth polysilicon layers. Pre-cleaning can be performed using QEII having a very low etch rate on the nitridation layer 1110 such that the majority of the formed nitridation layer 1110 is maintained during the pre-cleaning process.

A conductive material can then be deposited over the cell nitride layer 1310 to form the top capacitor electrode 1320. The top electrode 1320 can comprise a conductive material such as doped polysilicon or a conductive metal. The conductive material can be deposited on the cell nitride layer 1310, by conventional methods, such as chemical vapor deposition (CVD), or physical vapor deposition (e.g., sputtering) for a metal plate to complete the container capacitor structure including a double-sided HSG electrode.

Double-Sided HSG Electrode with Oxide Cap

Another embodiment of a method of the present invention is described using FIGS. 14–21 to form a double-sided container capacitor including an oxide cap on a double-sided HSG bottom electrode to reduce cell-to-cell shorts caused by HSG floaters and other conductive surface defects.

Figure 14:
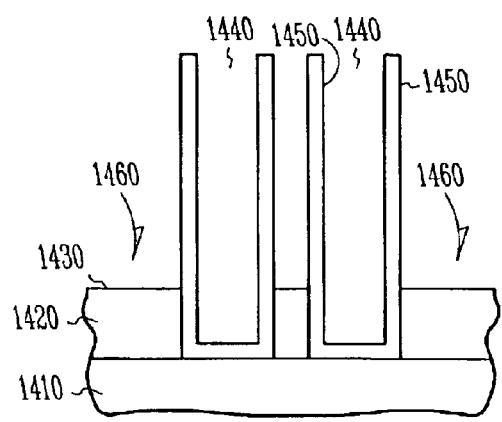
FIGS. 14–21 are cross-sectional views of a wafer fragment that illustrate sequential fabrication operations of yet another embodiment of the present invention.

Referring now to FIG. 14, a portion of a semiconductor wafer 1400 is shown at a preliminary processing step. The wafer fragment 1400 in progress can include a semiconductor wafer substrate or the wafer along with various process layers formed thereon, including one or more semiconductor layers or other formations, and active or operable portions of semiconductor devices.

The wafer fragment 1400 is shown including a substrate 1410, a first overlying insulative layer 1420, and a wet etch stop layer 1430. The substrate can include semiconductor-based materials, such as silicon-on insulator (SOI), silicon-on sapphire (SOS), doped and undoped semiconductors, epitaxial layers of silicon supported by a base semiconductor foundation, and/or other semiconductor-based materials. The semiconductor-based materials can also include materials, such as silicon-germanium, germanium, and/or gallium arsenide. Insulative layer 1420 can include materials, such as silicon dioxide ($SiO_2$), phosphosilicate glass (PSG), borosilicate glass (BSG), and borophosphosilicate glass (BPSG).

Also shown in FIG. 14 are multiple dual-sided smooth polysilicon containers or openings 1440 that have been formed by conventional dry etching through the first insulative layer 1420 and a second BPSG insulative layer overlying the wet etch stop layer 1430 (not shown) that has been removed by an etchant 1460 that does not significantly affect the wet etch stop layer 1430. Solutions, such as $CF_4$ or $C_4F_6$ can be used in the conventional dry etch process to form the containers 1440. For simplicity and a better understanding of a memory cell structure, only a few containers 1440 are shown in FIG. 14, though it can be envisioned that the substrate can include an array of memory cells including similar containers. The dual-sided smooth polysilicon containers 1440 are formed by depositing a layer of hemispherical silicon grain (HSG) polysilicon 1450 using a combo HSG process within each of the openings and over interior surfaces of the containers 1440 to form a cup-shaped structure for the bottom electrode within the openings.

HSG polysilicon layer 1450 formation is well known in this art and many different known processes may be used in conjunction with the present invention. The example embodiment of forming HSG polysilicon layer 1450 disclosed in the present invention is by depositing a layer of an amorphous doped and undoped bilayer or trilayer polysilicon within each of the openings or over interior surfaces of the containers 1440 to form a cup-shaped structure. By cup-shaped, it is understood to include any of circular, square, rectangular, trapezoidal, triangular, oval or rhomboidal, among other shapes, with respect to the top down view of the lower electrodes.

The wet etch stop layer 1430 is conformally deposited over the first insulative layer 1420, has a characteristic etch rate in which etchants will selectively remove the second insulative layer in a later operation without significantly etching the etch stop layer 1430. The wet etch stop layer 1430 can include, for example, a silicon nitride ($SiN_x$) layer of about 100 to 200 Å thick, or $SiO_2$ formed by decomposition of a tetraethylorthosilicate (TEOS) precursor in the range of about 500 to 1000 Å.

Figure 15:
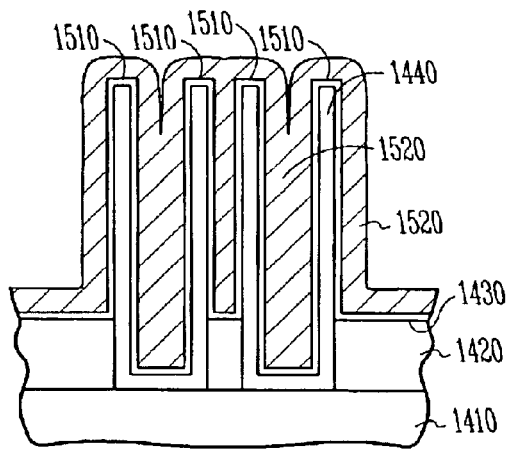

Referring to FIGS. 14 and 15, a thin nitride layer 1510 is conformally deposited over and around the dual-sided smooth polysilicon containers 1440. In some embodiments, the thickness of the thin nitride layer 1510 is around 50 to 65 Å. In these embodiments, the nitride layer 1510 is formed using a low-pressure chemical vapor deposition (LPVCD) process at temperatures less than 500° C. using materials, such as $Si_2Cl_6$ nitride, $SiCl_4$ nitride, or trichlorosilicane (TCS) nitride.

As shown in FIG. 15, a thick barrier layer 1520 is conformally deposited over the thin nitride layer 1510 such that the barrier layer 1520 fills in and around the containers 1440. The barrier layer 1520 is formed using a titanium nitride (TiN) layer in the embodiment shown in FIG. 15. A TiN barrier layer 1520 can be formed by a conventional thermal chemical vapor deposition (TCVD), plasma enhanced CVD (PECVD), or atomic layer deposition (ALD), utilizing a source gas comprising precursors of tetrakisdimethyl-amidotitanium (TDMAT)(($CH_3)_2N)_4Ti$) and ammonia ($NH_3$), or titanium tetrachloride ($TiCl_4$) and $NH_3$. The thickness of the TiN barrier layer 1520 can be in the range of about 500 to 1000 Å.

Figure 16:
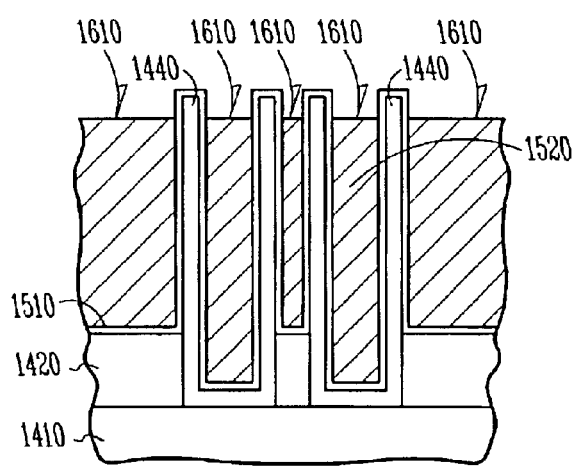

Referring now to FIG. 16, a top portion of the formed TiN barrier layer 1520 inside and around the container openings 1440, is subjected to a conventional dry etch 1610 to form a recess and to expose the nitride layer 1510 around the top portion of the dual-sided polysilicon containers 1440. A suitable dry etch to expose the top portion of the nitride layer of the dual-sided containers comprises exposing the wafer 1400 to $CF_4$ or $C_4F_6$, among others, at a temperature range of about 25° C. to 150° C., a pressure of about 30 to 100 mTorr, and a gas flow rate of about 30 to 100 sccm.

Figure 17:
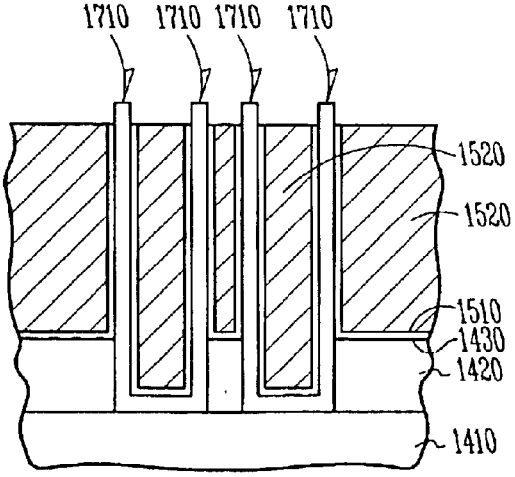

Referring now to FIGS. 15 and 17, the thin nitride layer 1510 disposed inside and around the dual-sided polysilicon containers 1440, is subjected to a wet nitride etching 1710 to remove the exposed thin nitride layer 1510 on the top portion to further expose the top portion polysilicon of the dual-sided polysilicon containers 1440.

Figure 18:
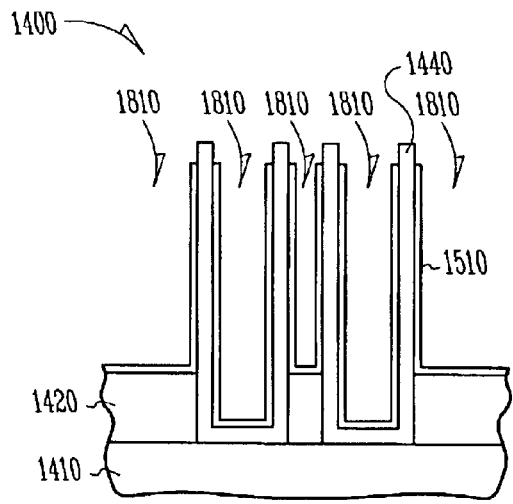

As shown in FIGS. 17 and 18, the remaining TiN barrier layer 1520 is then completely stripped from in and around the containers 1440 to expose the remaining thin nitride layer 1510. In some embodiments, the remaining TiN barrier layer 1520 is stripped using a conventional piranha wet etch 1810, for example, by immersing the wafer 1400 in a solution of sulfuric acid ($H_2SO_4$) and an oxidant such a hydrogen peroxide ($H_2O_2$).

Figure 19:
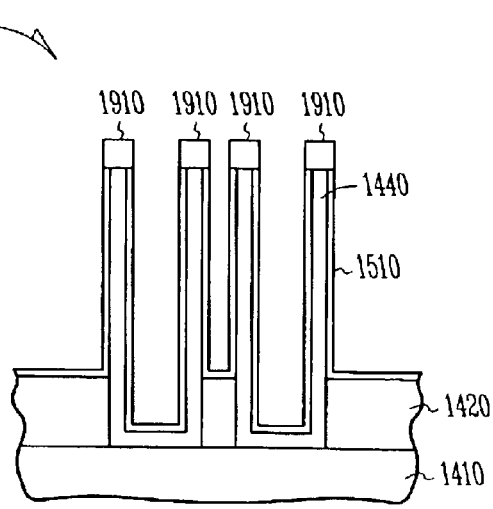

Referring to FIG. 19, the exposed polysilicon in the top portion of the dual-sided containers 1440 is then oxidized. In some embodiments, the exposed polysilicon is oxidized at temperatures below 500° C. using an oxidation process such as, ultraviolet ozone (UV O3) to form an oxide cap 1910 on the top portion of the dual-sided containers 1440.

Figure 20:
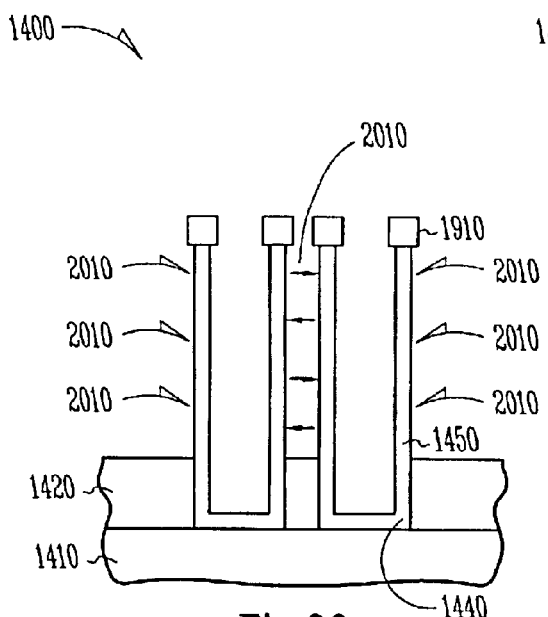

As depicted in FIGS. 19 and 20, the remaining nitride layer 1510 over the dual-sided polysilicon containers 1440 is then removed using a nitride wet etch process 2010. In some embodiments, the nitride wet etch 2010 process to remove the nitride layer 1510 is performed using a solution including 85% of $H_3PO_4$ at a temperature around 146° C. Because the thickness of the oxide cap is significantly higher than the thickness of the thin nitride layer 1510 formed over the polysilicon containers 1440, and also because the etch rate of the thin nitride layer 1510 is 29 Å per minute as opposed to 0.1 Å per minute for the oxide cap formed on the top portion of the polysilicon containers 1440, only the thin nitride layer 1510 will be removed during the nitride wet etching 2010 leaving the self-aligned oxide cap on the top portion of each of the polysilicon containers 1440.

Figure 21:
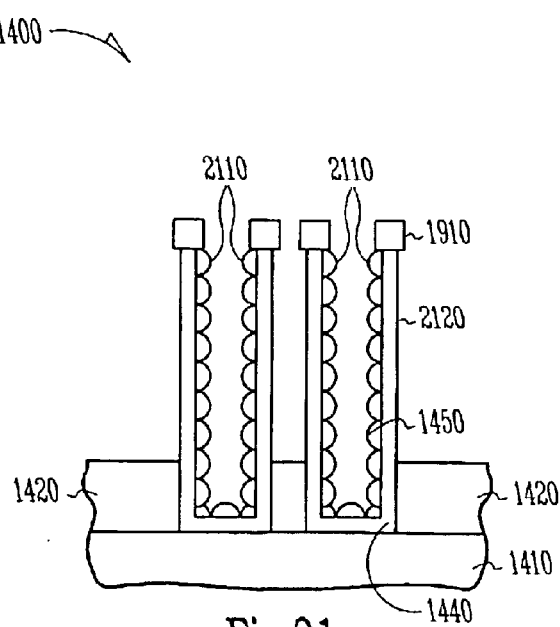

Referring to FIG. 21, crystalline poly seeds are then deposited on the inside layer of the doped and undoped amorphous bilayer or trilayer polysilicon 1450. Then, the cup-shaped structures including the layers of polysilicon and poly seeds are annealed to grow the HSG polysilicon from the crystalline seeds through silicon diffusion. The thickness of the bottom electrode layer formed using HSG polysilicon can be in the range of about 350 to 500 Å. The formed HSG polysilicon layer has a smooth exterior surface 2120 and a rough interior surface 2110. Formation of the HSG polysilicon layer is explained in detail with reference to FIG. 14.

All of the above-described processes with reference to FIGS. 14–20 are performed at temperatures below 500° C. so that the amorphous undoped polysilicon layer 1450 is not crystallized until the HSG conversion described in FIG. 21. In addition, the oxide cap 1910 formed on the polysilicon containers 1440 prevent the HSG conversion on the top portion of the containers 1440 to prevent any cell-to-cell short caused by any HSG floaters or defection formed during the HSG conversion process described with reference to FIG. 21. Therefore, the top oxide cap 1910 basically functions as an insulative layer to isolate the cells to prevent any cell-to-cell shorts that can occur due to formation of surface defects during the HSG conversion process.

A cell nitride layer (second dielectric layer) comprising silicon nitride ($SiN_x$) can then be conformally deposited over the roughened interior surface 2110 and the smooth exterior surface 2120 of the HSG polysilicon bottom electrode containers 1440 including the oxide cap. In some embodiments, the second dielectric layer is around 45 to 50 Å thick. A conductive material is then deposited over the cell nitride layer to form the top capacitor electrode. The deposition of the cell nitride layer and the conductive material over the bottom electrode is described in more detail with reference to FIG. 13.

Double-Sided HSG Electrode with Nitride Cap

Another embodiment of a method of the present invention is described using FIGS. 22–27 to form a double-sided container capacitor including the oxide cap on a double-sided HSG bottom electrode to reduce cell-to-cell short due to HSG floaters and other conductive surface defects falling on a wafer surface including the cells.

Figure 22:
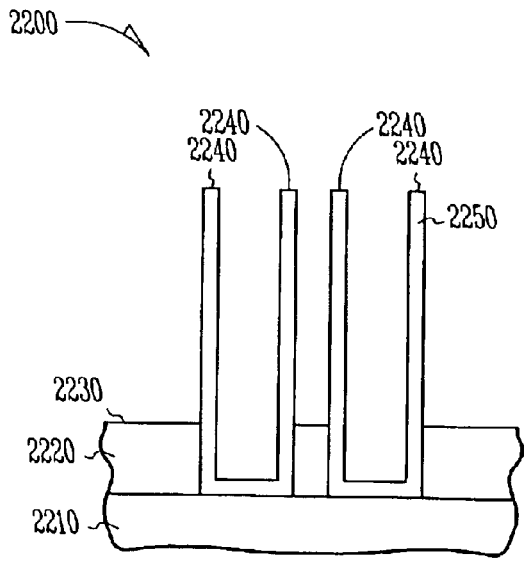
FIGS. 22–27 are cross-sectional views of a wafer fragment that illustrate another sequential fabrication process for the embodiment shown in FIGS. 14–21.

Referring now to FIG. 22, a portion of a semiconductor wafer 2200 is shown at a preliminary processing step. The wafer fragment 2200 in progress can include a semiconductor wafer substrate or the wafer along with various process layers formed thereon, including one or more semiconductor layers or other formations, and active or operable portions of semiconductor devices.

The wafer fragment 2200 is shown including a substrate 2210, a first overlying insulative layer 2220, and a wet etch stop layer 2230. The substrate can include semiconductor-based materials, such as silicon-on insulator (SOI), silicon-on sapphire (SOS), doped and undoped semiconductors, epitaxial layers of silicon supported by a base semiconductor foundation, and/or other semiconductor-based materials. The semiconductor-based materials can also include materials, such as silicon-germanium, germanium, and/or gallium arsenide. Insulative layer 2220 can include materials, such as silicon dioxide ($SiO_2$), phosphosilicate glass (PSG), borosilicate glass (BSG), and borophosphosilicate glass (BPSG).

Also shown in FIG. 22 are multiple dual-sided smooth polysilicon containers or openings 2240 that have been formed by conventional dry etching through the first insulative layer 2220 and a second BPSG insulative layer (that has been removed by an etchant that does not significantly affect the wet etch stop layer 2230) overlying the wet etch stop layer 2230 to an active region in the substrate 2210. Chemicals such as, $CF_4$ or $C_4F_6$, and other such chemicals can be used in the conventional dry etch process to form the containers 2240. For simplicity and a better understanding of a memory cell structure, only a few containers 2240 are shown in FIG. 22, though it can be envisioned that the substrate can include an array of memory cells including similar containers. The dual-sided smooth polysilicon containers 2240 are formed by depositing a layer of hemispherical silicon grain (HSG) polysilicon 2250 using a combo HSG process within each of the openings and over interior surfaces of the containers 2240 to form a cup-shaped structure for the bottom electrode within the openings.

The HSG polysilicon layer 2250 formation is well known in this art and many different known processes may be used in conjunction with the present invention. The example embodiment of forming HSG polysilicon layer 2250 disclosed in the present invention comprises depositing a layer of an amorphous doped and undoped bilayer or trilayer polysilicon within each of the openings or over interior surfaces of the containers 2240 to form a cup-shaped structure. By cup-shaped, it is understood to include any of circular, square, rectangular, trapezoidal, triangular, oval or rhomboidal, among other shapes, with respect to the top down view of the lower electrodes. In some embodiments, the dual-sided bottom electrode layer 2250 has a thickness in the range of about of 350 to 500 Å.

The wet etch stop layer 2230 is conformally deposited over the first insulative layer 2220, has a characteristic etch rate in which etchants will selectively remove the second insulative layer in a later operation without significantly etching the wet etch stop layer 2230. The wet etch stop layer 2230 can include, for example, silicon nitride ($SiN_x$) layer at about 100 to 200 Å thick, or $SiO_2$ formed by decomposition of a tetraethylorthosilicate (TEOS) precursor in the range of about 500 to 1000 Å.

Figure 23:
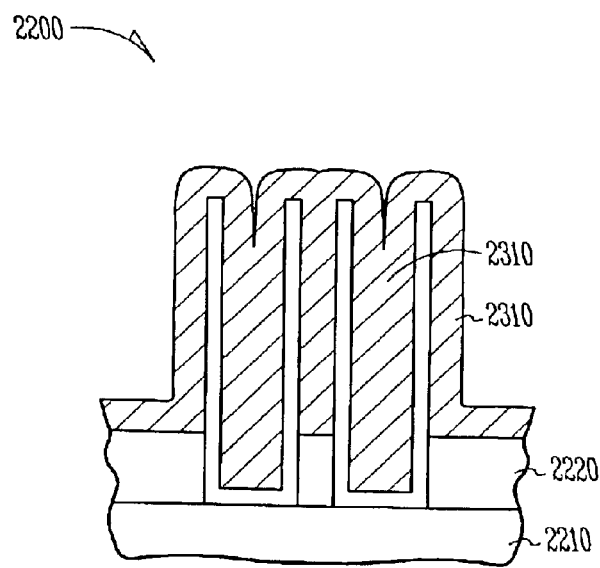

As shown in FIG. 23, a thick barrier layer 2310 is conformally deposited in and around the dual-sided smooth polysilicon containers 2240. The barrier layer 2310 is formed using a titanium nitride (TiN) layer in the embodiment shown in FIG. 15. A TiN barrier layer 2310 can be formed by a conventional thermal chemical vapor deposition (TCVD), plasma enhanced CVD (PECVD), or atomic layer deposition (ALD), utilizing a source gas comprising precursors of tetrakisdimethyl-amidotitanium (TDMAT)(($CH_3$)$_2N)_4Ti$) and ammonia ($NH_3$), or titanium tetrachloride ($TiCl_4$) and $NH_3$. The thickness of the TiN barrier layer 2310 can be in the range of about 500 to 1000 Å.

Figure 24:
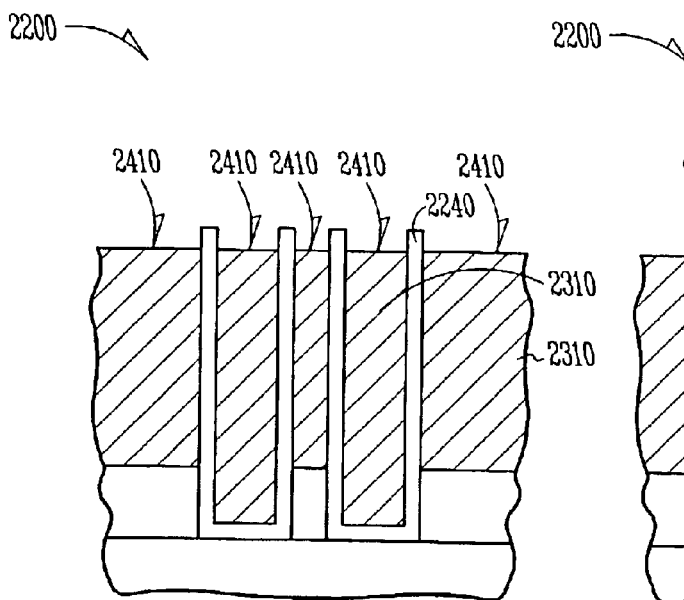

Referring now to FIG. 24, a top portion of the formed TiN barrier layer 2310 including inside and around the container openings 2240, is subjected to a conventional dry etch 2410 to form a recess and to expose the polysilicon around the top portion of the containers 2240. A suitable dry etch to expose the top portion of the nitride layer of the dual-sided containers comprises exposing the wafer 2200 to solutions, such as $CF_4$ or $C_4F_6$ at a temperature range of about 25° C. to 150° C., a pressure of about 30 to 100 mTorr, and a gas flow rate of about 30 to 100 sccm. In some embodiments, the recess is formed by dry etching 2410 the TiN barrier layer 2310 to remove the TiN barrier layer by about 200 to 500 Å into the containers 2240.

Figure 25:
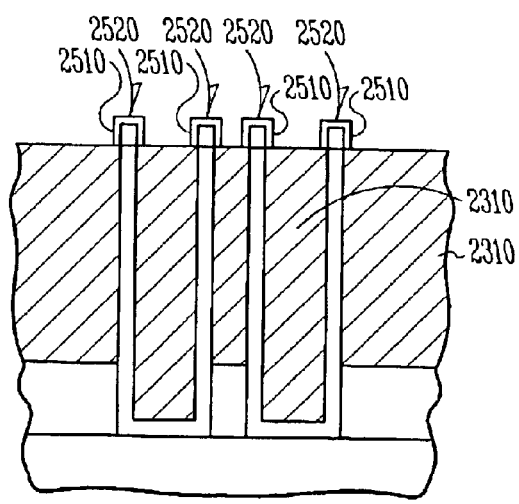

Referring to FIG. 25, the exposed polysilicon on the top portion of the dual-sided containers 2240 is then nitridized 2510. In some embodiments, the exposed polysilicon is nitridized 2510 at temperatures below 500° C. by exposing the top portion to a nitrogen-container gas 2520 to form a nitridation layer around 25 to 30 Å thick. The nitridizing process can be performed by remote plasma nitridation (RPN) or decoupled plasma nitridization (DPN) at temperatures below 500° C. Nitrogen-containing gases can be gases such as nitrogen ($N_2$) and ammonia ($NH_3$).

In some embodiments, the RPN is performed at a temperature below 500° C., a pressure of about 1 Torr, with a nitrogen precursor flow rate of about 10 sccm, for a duration of about 5 minutes, to form a nitride layer 2510 on the exposed polysilicon on the top portion of the dual-sided polysilicon containers 2240, to form a nitride layer of about 25 to 30 Å thick.

Figures 26, 27:
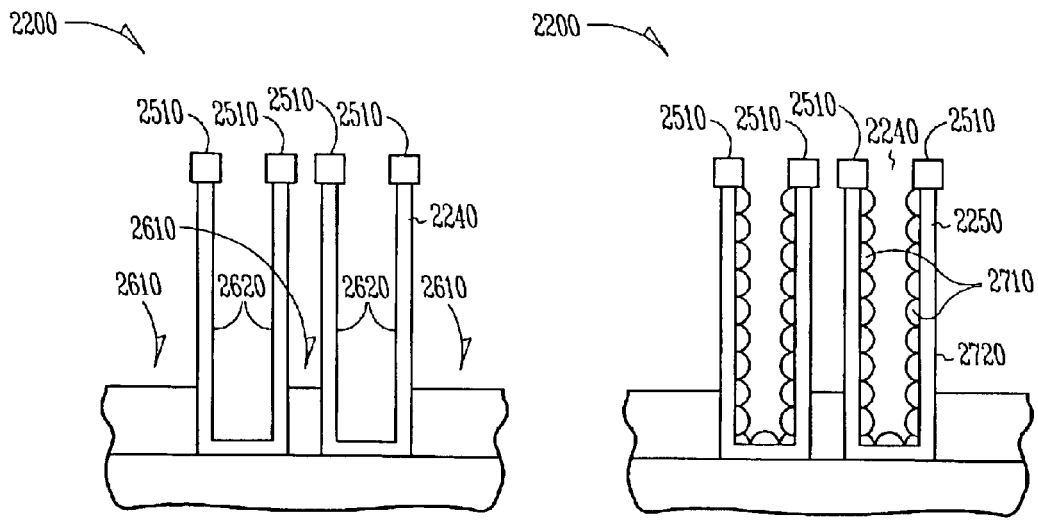

As shown in FIGS. 25 and 26, the remaining TiN barrier layer 2310 is then completely stripped from in and around the containers 2240 to expose the remaining thin nitride layer 2310. In some embodiments, the remaining TiN barrier layer 2310 is stripped using a conventional piranha wet etch 2610, for example, by immersing the wafer 2200 in a solution of sulfuric acid ($H_2SO_4$) and an oxidant such a hydrogen peroxide ($H_2O_2$). In some embodiments, the etchant provides an etch rate for piranha for TiN, and nitride around 550 Å per minute, and 0.4 Å per minute, respectively, and no etching of polysilicon.

In some embodiments, the inside polysilicon surface 2620 of the containers 2240 is pre-cleaned before depositing the cell nitride layer to remove any native oxides and TiSi formed during the above-described RPN process. Pre-cleaning can be performed by using a solution containing $NH_4F$ and $H_3PO_4$ (QEII) having a very low etch rate on the inside polysilicon layer such that the majority of the formed polysilicon layer is maintained during the pre-cleaning process. In some embodiments, the etch rate during the QEII cleaning is maintained at 48 Å per minute for native oxides, 50 Å per minute for TiSi, and 2 Å per minute for the nitride cap. Therefore, using a 60 to 100 second long QE II pre-cleaning, we can ensure that the nitride cap on the top portion of the dual-sided containers 2240 will have enough nitride layer left and the inside polysilicon surface is left clean for depositing the poly seeds after the QE II pre-cleaning.

Referring to FIG. 27, crystalline poly seeds are then deposited on the inside layer of the doped and undoped amorphous bilayer or trilayer polysilicon 2250. Then, the cup-shaped structures including the layers of polysilicon and poly seeds are annealed to grow the HSG polysilicon from the crystalline seeds through silicon diffusion. The thickness of the bottom electrode layer formed using HSG polysilicon can be in the range of about 350 to 500 Å. The formed HSG polysilicon layer has a smooth exterior surface 2720 and a rough interior surface 2710. Formation of the HSG polysilicon layer is explained in more detail with reference to FIG. 14.

All of the above-described processes with reference to FIGS. 22–27 are performed at temperatures below 500° C. so that the amorphous undoped polysilicon layer 2250 is not crystallized until the HSG conversion is performed as described with reference to FIG. 27. In addition, the nitride cap 2510 formed on the polysilicon containers 2240 prevent the HSG conversion on the top portion of the containers 2240 to prevent any cell-to-cell short caused by any HSG floaters or defection formed during the HSG conversion process described with reference to FIG. 27. Therefore, the top nitride cap 2510 basically functions as an insulative layer to isolate the cells to prevent any cell-to-cell shorts that can occur due to formation of surface defects during the HSG conversion process.

A cell nitride layer comprising silicon nitride (SiN$_x$) can then be conformally deposited over the roughened interior surface 2710 and the smooth exterior surface 2720 of the HSG polysilicon bottom electrode containers 2240 including the nitride cap 2250. A conductive material is then deposited over the cell nitride layer to form the top capacitor electrode. The deposition of the cell nitride layer and the conductive material over the bottom electrode containers 2240 is described in more detail with reference to FIG. 13.

Figure 28:
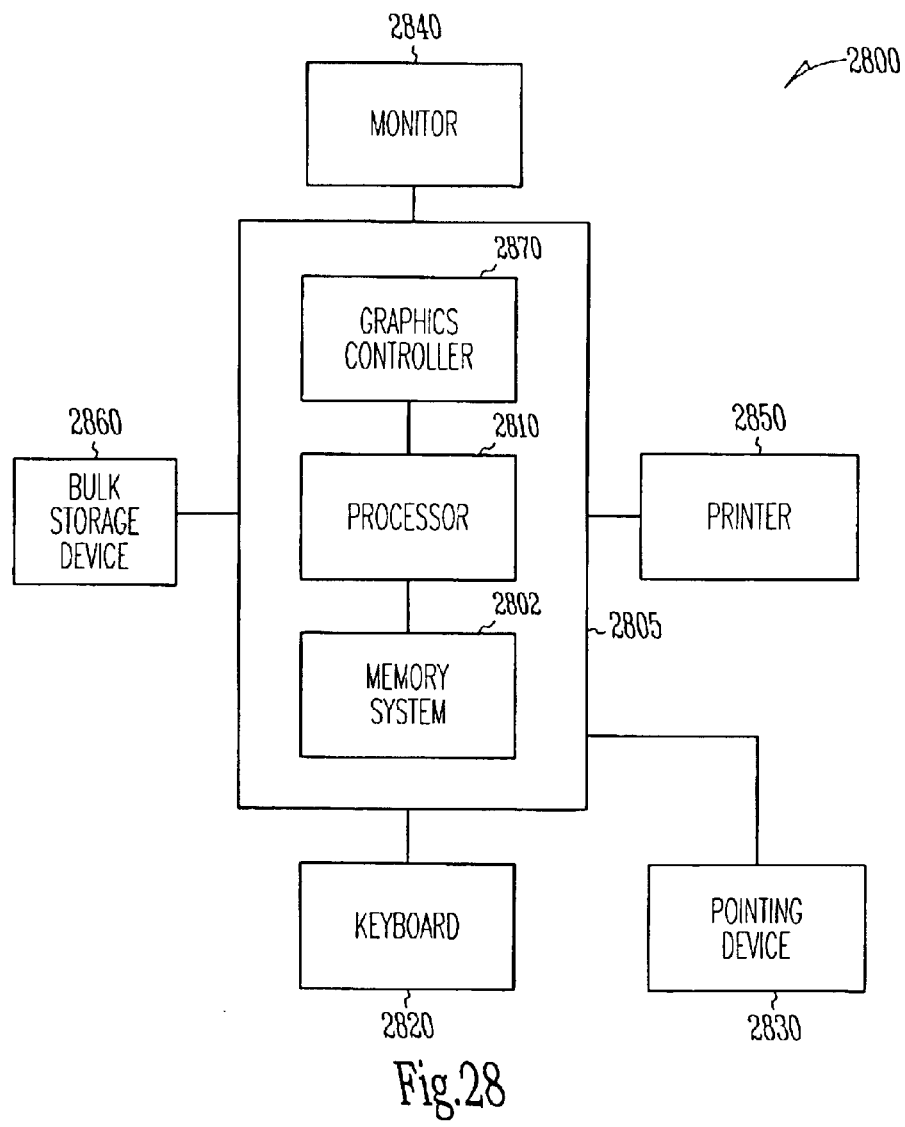
FIG. 28 is a block diagram of an exemplary computer system.

FIG. 28 is a block diagram of a system according to one embodiment of the present invention. Computer system 2800 contains a processor 2810 and a memory system 2802 housed in a computer unit 2805. Computer system 2800 is but one example of an electronic system containing another electronic system, e.g., memory system 2802, as a subcomponent. The memory system 2802 includes a memory device that includes a memory cell array as discussed in various embodiments of the present invention. Computer system 2800 optionally contains user interface components. These user interface components include a keyboard 2820, a pointing device 2830, a monitor 2840, a printer 2850, and a bulk storage device 2860. It will be appreciated that other components are often associated with computer system 2800 such as modems, device driver cards, additional storage devices, etc. It will further be appreciated that the processor 2810 and memory system 2802 of computer system 2800 can be incorporated on a single integrated circuit. Such single-package processing units reduce the communication time between the processor and the memory circuit. Any of these components of the system may contain a memory device that includes the double-sided HSG electrode of the present invention. This is particularly true of a graphics subsystem 2870 of FIG. 28 utilizing SGRAM that includes the multiple-mode output driver as discussed in various embodiments of the present invention.

Figure 29:
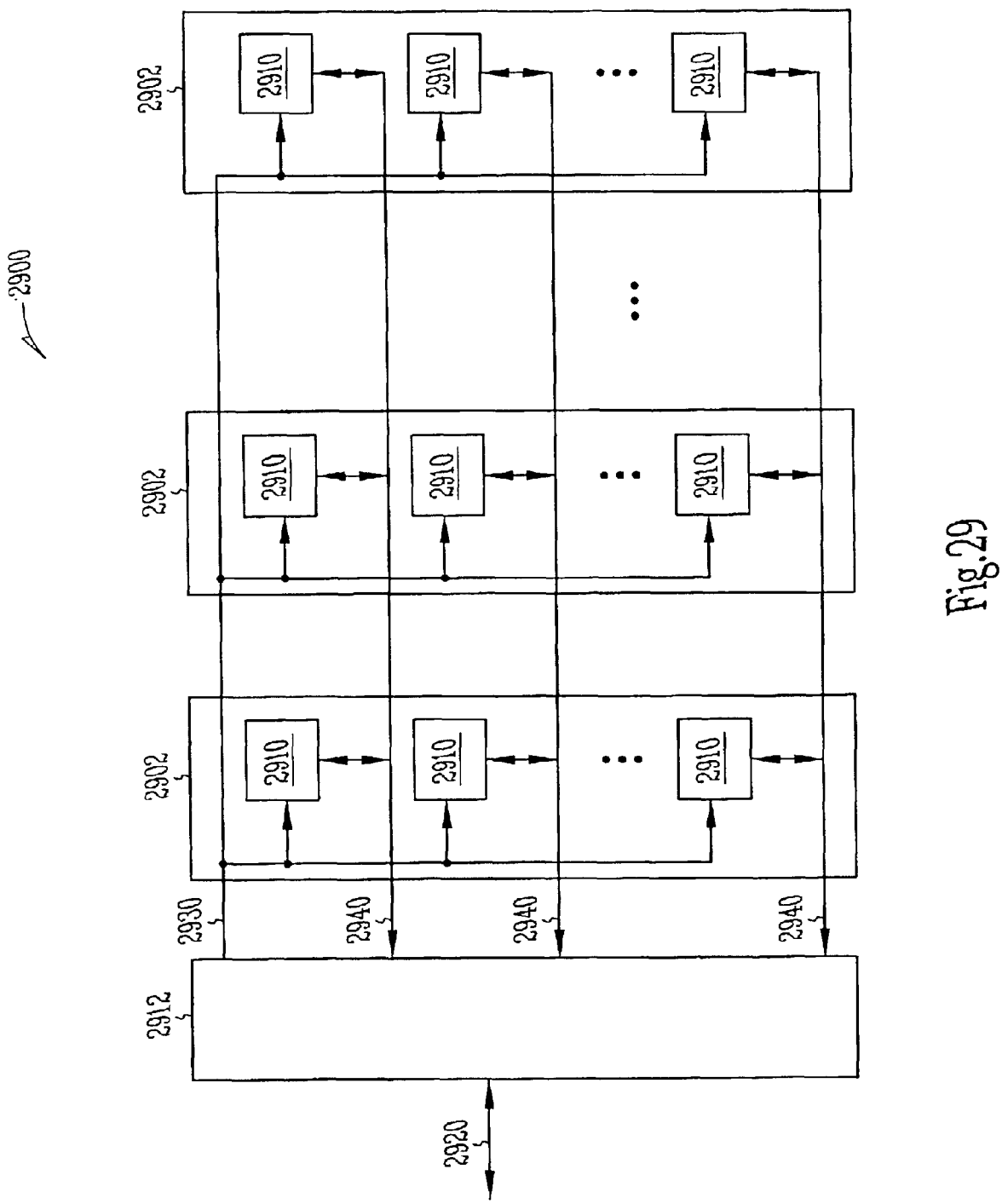
FIG. 29 is a block diagram of an exemplary memory system.

FIG. 29 is a block diagram of a system according to one embodiment of the present invention. Memory system 2900 contains one or more memory modules 2902 and a memory controller 2912. Each memory module 2902 includes at least one memory device 2910. Memory controller 2912 provides and controls a bidirectional interface between memory system 2900 and an external system bus 2920. Memory system 2900 accepts a command signal from the external bus 2920 and relays it to the one or more memory modules 2902 on a command link 2930. Memory system 2900 provides for data input and data output between the one or more memory modules 2902 and external system bus 2920 on data links 2940. At least one of the memory devices 2910 includes the memory cell array as discussed in various embodiments of the present invention. At least one of the memory devices 2910 includes the double-sided HSG electrodes of the present invention.

Figure 30:
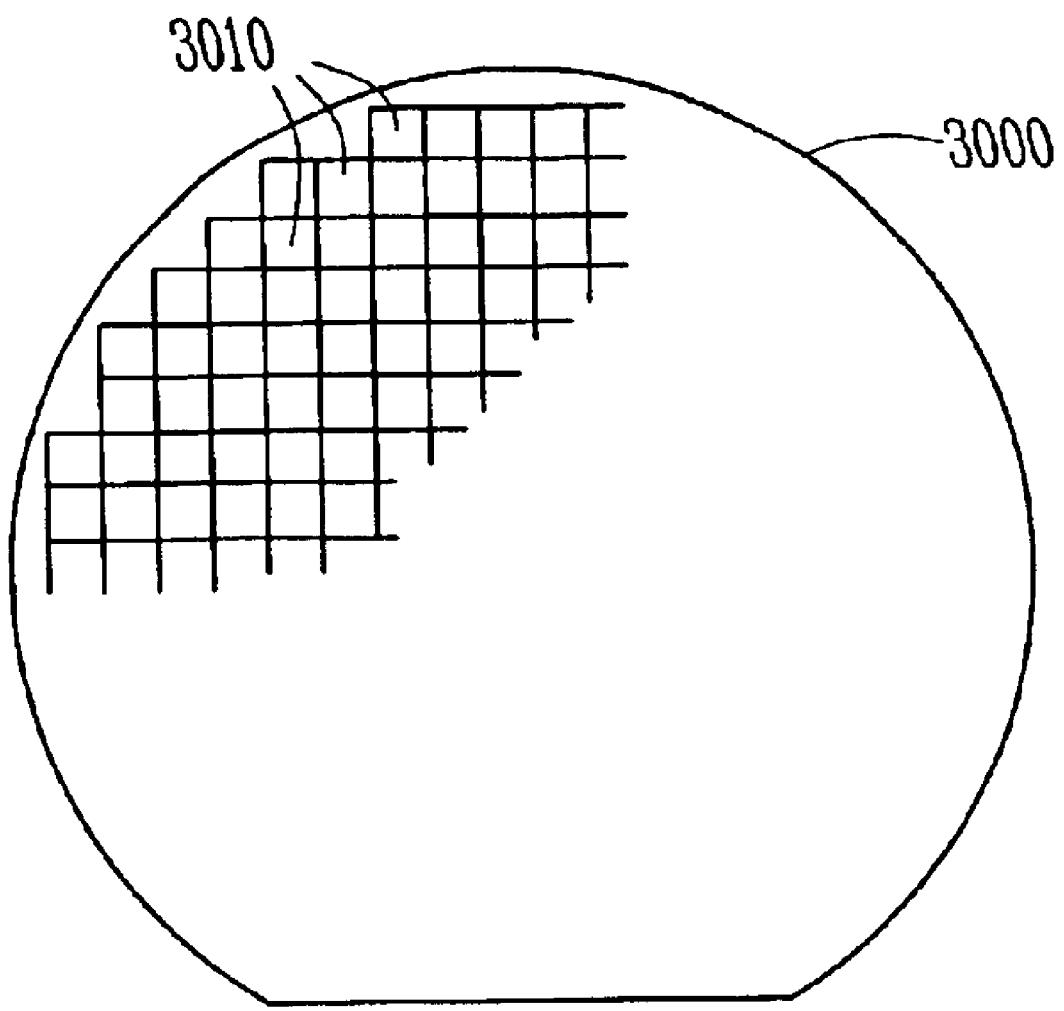
FIG. 30 is an elevation view of a substrate containing semiconductor dies.

With reference to FIG. 30, in one embodiment, a semiconductor die 3010 is produced from a silicon wafer 3000. A die is an individual pattern, typically rectangular, on a substrate that contains circuitry to perform a specific function. A semiconductor wafer will typically contain a repeated pattern of such dies containing the same functionality. Die 3010 may contain circuitry for the memory device, as discussed above. Die 3010 may further contain additional circuitry to extend to such complex devices as a monolithic processor with multiple functionality. Die 3010 is typically packaged in a protective casing (not shown) with leads extending there from (not shown) providing access to the circuitry of the die for unilateral or bilateral communication and control.

The above description illustrates preferred embodiments, which achieve the features and advantages of the present invention. It is not intended that the present invention be limited to the illustrated embodiments. Modifications and substitutions to specific process conditions and structures can be made without departing from the spirit and scope of the present invention. Accordingly, the invention is not to be considered as being limited by the foregoing description and drawings, but is only limited by the scope of the appended claims.

What is claimed is:

1. A method comprising: forming a container electrode including:
   forming a bottom electrode layer by using a hemispherical silicon grain (HSG) polysilicon over interior surfaces and smooth polysilicon over exterior surface of a container formed in a substrate;
   forming a barrier layer over the HSG polysilicon layer;
   removing any HSG polysilicon and barrier layers formed over the substrate and around the container opening to expose an upper surface of the substrate;
   removing the substrate comprising silicon oxide material to expose a portion of outside surface of the formed smooth polysilicon layer;
   after removing the substrate comprising silicon oxide material removing the barrier layer to expose interior surfaces of the HSG polysilicon layer; and
   forming a silicon nitride layer over the HSG polysilicon layer after removing the barrier layer to expose interior surfaces of the HSG polysilicon layer, the silicon nitride layer formed in contact with the HSG polysilicon layer.

2. The method of claim 1, further comprising:
   forming a top electrode over the deposited cell nitride layer.

3. The method of claim 2, wherein the top electrode is formed using a conductive material selected from the group consisting of polysilicon and silicon germanium (SiGe).

4. The method of claim 1, wherein the container has a cross-sectional shape, in a top down view, selected from the group consisting of circular, square, rectangular, trapezoidal, triangular, oval, and rhomboidal shapes.

5. The method of claim 1, wherein the bottom electrode HSG polysilicon layer is formed to provide a cup-shaped structure for the bottom electrode.

6. A method comprising: forming a container electrode indluding:
   depositing a layer of an amorphous doped and undoped bilayer silicon over an interior surface of a container in a substrate;
   depositing crystalline poly seeds over the deposited layer of amorphous doped and undoped bilayer silicon;
   growing the HSG polysilicon layer from the crystalline poly seeds by annealing the poly seeded layer of amorphous doped and undoped bilayer silicon using silicon diffusion to form a bottom electrode layer;
   forming a barrier layer over the HSG polysilicon layer;
   removing any HSG polysilicon and barrier layers formed over the substrate and around the container opening to expose an upper surface of the substrate;
   removing the substrate comprising silicon oxide material to expose a portion of outside surface of the formed smooth polysilicon layer;
   after removing the substrate comprising silicon oxide material removing the barrier layer to expose interior surfaces of the HSG polysilicon layer; and
   forming a silicon nitride layer over the HSG polysilicon layer after removing the barrier layer to expose interior surfaces of the HSG polysilicon layer, the silicon nitride layer formed in contact with the HSG polysilicon layer.

7. The method of claim 6 wherein the formed bottom electrode layer has a thickness in the range of about 350 to 500 Å.

8. The method of claim 6 wherein removing the HSG polysilicon and the barrier layers formed over the substrate and around the container opening comprises using a process selected from the group consisting of chemical mechanical polishing and dry etch.

9. The method of claim 6 wherein removing the substrate to expose a portion of outside surface of the formed HSG polysilicon layer comprises wet etching using a hydrofluoric acid (HF) solution for about 345 seconds.

10. The method of claim 9 wherein the HF solution comprises a 10:1 HF solution.

11. A method comprising: forming a container electrode including:
    forming a bottom electrode layer by using a hemispherical silicon grain (HSG) polysilicon over interior surfaces and smooth polysilicon over exterior surface of a container formed in a substrate;
    forming a TiN layer over the formed HSG polysilicon layer;
    removing any HSG polysilicon and barrier layers formed over the substrate and around the container opening to expose an upper surface of the substrate;
    removing the substrate to expose a portion of outside surface of the formed smooth polysilicon layer;
    after removing the substrate, removing the TiN layer to expose interior surfaces of the HSG polysilicon layer; and
    forming a silicon nitride layer over the HSG polysilicon layer after removing the TiN layer to expose interior surfaces of the HSG polysilicon layer, the silicon nitride layer formed in contact with the HSG polysilicon layer.

12. The method of claim 11, wherein the TiN layer is deposited by a vapor deposition process selected from the group consisting of a chemical vapor deposition (CVD) and a physical vapor deposition (PVD).

13. The method of claim 12, wherein the TiN layer is about 100 to 200 Å thick.

14. The method of claim 12, wherein removing the TiN layer to expose the interior surfaces of the HSG polysilicon layer comprises removing the TiN layer using a piranha wet etch.

15. The method of claim 14, wherein the etchant provides an etch rate of piranha for TiN around 550 Å per minute.

16. The method of claim 15, wherein the etchant for piranha is applied for up to about 2 minutes.

17. A method comprising: forming a double-sided container electrode, including:
    providing a substrate comprising a first insulative layer, an overlying etch stop layer, an overlying second insulative layer, and a container extending through the insulative layers and the etch stop layer into the substrate;
    forming a bottom electrode layer by using a HSG polysilicon material over interior surfaces of the container formed in the substrate;
    forming a barrier layer over the HSG polysilicon layer;
    removing any HSG polysilicon and barrier layers formed outside and around the container opening to expose the second insulative layer;
    wet etching the second insulative layer comprising silicon oxide material to expose the etch stop layer and the HSG polysilicon layer outside the container;
    after wet etching the second insulative layer comprising silicon oxide material removing the barrier layer to expose interior surfaces of the HSG polysilicon layer to form the double-sided container electrode; and
    forming a silicon nitride layer over the HSG polysilicon layer after removina the barrier layer to expose interior surfaces of the HSG polysilicon layer, the silicon nitride layer formed in contact with the HSG polysilicon layer.

18. The method of claim 17, further comprising:
    forming a top electrode over the deposited cell nitride layer.

19. The method of claim 17, wherein the container has a cross-sectional shape, in a top down view, selected from the group consisting of circular, square, rectangular, trapezoidal, triangular, oval, and rhomboidal shapes.

20. The method of claim 17, wherein the HSG polysilicon layer is formed to provide a cup-shaped structure for the bottom electrode.

21. The method of claim 20, wherein forming the HSG polysilicon layer to provide a cup-shaped structure for the bottom electrode comprises:
    depositing a layer of an amorphous doped and undoped bilayer polysilicon over the interior surfaces of the container;
    depositing crystalline poly seeds over the deposited layer of amorphous doped and undoped bilayer silicon; and
    growing the HSG from the crystalline poly seeds by annealing the poly seeded layer of amorphous doped and undoped bilayer silicon using silicon diffusion.

22. A method comprising: forming a double-sided container electrode, including:
    providing a substrate comprising a first insulative layer, an overlying etch stop layer, an overlying second insulative layer, and a container extending through the insulative layers and the etch stop layer into the substrate;
    forming a bottom electrode layer having a thickness in the range of about 350 to 500 Å by using a HSG polysilicon material over interior surfaces of the container formed in the substrate;
    forming a barrier layer over the HSG polysilicon layer;
    removing any HSG polysilicon and barrier layers formed outside and around the container opening to expose the second insulative layer;
    wet etching the second insulative layer comprising silicon oxide material to expose the etch stop layer and the HSG polysilicon layer outside the container;
    after wet etching the second insulative layer comprising silicon oxide material removing the barrier layer to expose interior surfaces of the HSG polysilicon layer to form the double-sided container electrode; and
    forming a silicon nitride layer over the HSG polysilicon layer after removing the barrier layer to expose interior surfaces of the HSG polysilicon layer, the silicon nitride layer formed in contact with the HSG polysilicon layer.

23. The method of claim 22, wherein removing the HSG polysilicon and barrier layers formed over the substrate and around the container opening comprises using a process selected from the group consisting of chemical mechanical polishing and dry etch.

24. The method of claim 22, wherein the first and second insulative layers comprise materials selected from the group consisting of borophosphosilicate glass (BPSG), BSG, PSG, and silicon dioxide ($SiO_2$).

25. The method of claim 22, wherein wet etching the second insulative layer comprises:
    wet etching the second insulative layer using a HF solution for about 345 seconds to expose a portion of the outside surface of the formed HSG polysilicon layer.

26. A method comprising: forming a double-sided container electrode, including:
    providing a substrate comprising a first insulative layer, an overlying etch stop layer, an overlying second insulative layer, and a container extending through the insulative layers and the etch stop layer into the substrate;
    forming a bottom electrode layer having a thickness in the range of about 350 to 500 Å by using a HSG polysilicon material over interior surfaces of the container formed in the substrate;
    forming a titanium nitride (TiN) barrier layer over the HSG polysilicon layer;
    removing any HSG polysilicon and barrier layers formed outside and around the container opening to expose the second insulative layer;
    wet etching the second insulative layer to expose the etch stop layer and the HSG polysilicon layer outside the container;
    after wet etching the second iinsulative layer, removing the TiN barrier layer to expose interior surfaces of the HSG polysilicon layer to form the double-sided container electrode; and
    forming a silicon nitride layer over the HSG polysilicon layer after removing the TiN barrier layer to expose interior surfaces of the HSG polysilicon layer, the silicon nitride layer formed in contact with the HSG polysilicon layer.

27. The method of claim 26, wherein the TiN layer is deposited by a vapor deposition process selected from the group consisting of CVD and PVD.

28. The method of claim 26, wherein removing the TiN barrier layer to expose the interior surfaces of the HSG polysilicon layer comprises removing the TiN layer using a piranha wet etch.

29. The method of claim 26, wherein the etch stop layer comprises a silicon dioxide layer formed by decomposition of a TEOS precursor.

30. A method comprising: forming a container electrode including:
    forming a bottom electrode layer by using a hemispherical silicon grain (HSG) polysilicon layer over interior surfaces of a container formed in a substrate;
    forming a barrier layer over the HSG polysilicon layer;
    removing any HSG polysilicon and barrier layers formed over the substrate and around the container opening to expose the upper surface of the substrate;
    removing the substrate comprising silicon oxide material to expose a portion of outside surface of the formed HSG polysilicon layer;
    after removing the substrate comprising silicon oxide material removing the barrier layer to expose interior surfaces of the HSG polysilicon layer;
    depositing a layer of cell nitride over the HSG polysilicon layer after removing the barrier layer to expose interior surfaces of the HSG polysilicon layer, the cell nitride including silicon nitride in contact with the HSG polysilicon layer; and
    forming a top electrode over the deposited cell nitride layer.

31. The method of claim 30, wherein the top electrode is formed using conductive material selected from the group consisting of polysilicon and silicon germanium (SiGe).

32. The method of claim 30, wherein the container has a cross-sectional shape, in a top down view, selected from the group consisting of circular, square, rectangular, trapezoidal, triangular, oval, and rhomboidal shapes.

33. The method of claim 30, wherein the bottom electrode layer is formed to provide a cup-shaped structure for the bottom electrode.

34. A method comprising: forming a container electrode including:
    forming a bottom electrode layer by depositing a layer of an amorphous doped and undoped bilayer silicon over the interior surfaces of the container, by further depositing crystalline poly seeds over the deposited layer of amorphous doped and
    undoped bilayer silicon, and by further growing HSG from the crystalline poly seeds by annealing the poly seeded layer of amorphous doped and undoped bilayer silicon using silicon diffusion;
    forming a barrier layer over the HSG polysilicon layer;
    removing any HSG polysilicon and barrier layers formed over the substrate and around the container opening to expose the upper surface of the substrate;
    removing the substrate comprising silicon oxide material to expose a portion of outside surface of the formed HSG polysilicon layer;
    after removing the substrate comprising silicon oxide material removing the barrier layer to expose interior surfaces of the HSG polysilicon layer; and
    forming a silicon nitride layer over the HSG polysilicon layer after removina the barrier layer to expose interior surfaces of the HSG polysilicon layer, the silicon nitride layer formed in contact with the HSG polysilicon layer.

35. The method of claim 34, further comprising:
    forming a top electrode over the deposited cell nitride layer.

36. The method of claim 35, wherein the top electrode is formed using a conductive material selected from the group consisting of polysilicon and silicon germanium (SiGe).

37. The method of claim 34, wherein the container has a cross-sectional shape, in a top down view, selected from the group consisting of circular, square, rectangular, trapezoidal, triangular, oval, and rhomboidal shape.

38. The method of claim 34, wherein the bottom electrode layer is formed to provide a cup-shaped structure for the bottom electrode.

39. The method of claim 34, wherein the formed bottom electrode layer has a thickness in the range of about 350 to 500 Å.

40. A method comprising: forming a container electrode including:
    forming a bottom electrode layer by depositing a layer of an amorphous doped and undoped bilayer silicon over the interior surfaces of the container, by further depositing crystalline poly seeds over the deposited layer of amorphous doped and undoped bilayer silicon, and by further growing HSG from the crystalline poly seeds by annealing the poly seeded layer of amorphous doped and undoped bilayer silicon using silicon diffusion;

forming a barrier layer over the HSG polysilicon layer;

removing any HSG polysilicon and barrier layers formed over the substrate and around the container opening to expose the upper surface of the substrate;

removing the substrate comprising silicon oxide material to expose a portion of outside surface of the formed HSG polysilicon layer;

after removing the substrate comprising silicon oxide material removing the barrier layer to expose interior surfaces of the HSG polysilicon layer;

depositing a layer of cell nitride over the HSG polysilicon layer after removing the barrier layer to expose interior surfaces of the HSG polysilicon layer, the cell nitride including silicon nitride in contact with the HSG polysilicon layer; and forming a top electrode over the deposited cell nitride layer.

41. The method of claim 40, wherein the top electrode is formed using a conductive material selected from the group consisting of polysilicon and silicon germanium (SiGe).

42. The method of claim 40, wherein the container has a cross-sectional shape, in a top down view, selected from the group consisting of circular, square, rectangular, trapezoidal, triangular, oval, and rhomboidal shapes.

43. The method of claim 40, wherein the formed bottom electrode layer has a thickness in the range of about 350 to 500 Å.

44. A method of fabricating an integrated memory circuit device comprising: fabricating an array of memory cells, wherein each of the memory cells includes a double-sided container electrode, including:

providing a substrate comprising a first insulative layer, an overlying etch stop layer, an overlying second insulative layer, and a plurality of containers extending through the insulative layers and the etch stop layer into the substrate;

forming a bottom electrode layer using a HSG polysilicon material over interior surfaces of the containers formed in the substrate;

forming a barrier layer over the HSG polysilicon layer;

removing any HSG polysilicon and barrier layers formed over the substrate and around around the container's opening;

wet etching the second insulative layer comprising silicon oxide material to expose the etch stop layer and the HSG polysilicon layer outside the containers;

after wet etching the second insulative layer coomprising silicon oxide material removing the barrier layer to expose interior surfaces of the HSG polysilicon layer in the containers; and forming a silicon nitride layer over the HSG polysilicon layer after removing the barrier layer to expose interior surfaces of the HSG polysilicon layer, the silicon nitride layer formed in contact with the HSG polysilicon layer.

45. The method of claim 44, further comprising:

forming a top electrode over the deposited cell nitride layer in the containers.

46. The method of claim 44, wherein the containers have a cross-sectional shape, in a top down view, selected from the group consisting of circular, square, rectangular, trapezoidal, triangular, oval, and rhomboidal shapes.

47. The method of claim 44, wherein the HSG polysilicon layer is formed to provide a cup-shaped structure for the bottom electrode.

48. The method of claim 44, wherein wet etching the second insulative layer comprises:

wet etching the second insulative layer to expose a portion of outside surface of the formed HSG polysilicon layer using a hydrofluoric acid (HF) solution for about 345 seconds.

49. A method of fabricating a logic circuit comprising: fabricating an array of memory cells, wherein each memory cell in the array includes a double-sided container electrode, including:

providing a substrate comprising a first insulative layer, an overlying etch stop layer, an overlying second insulative layer, and multiple containers extending through the insulative layers and the etch stop layer into the substrate;

forming a bottom electrode layer using a HSG polysilicon material over interior surfaces of the containers formed in the substrate;

forming a barrier layer over the HSG polysilicon layer in the containers;

removing any HSG polysilicon and barrier layers formed over the substrate and around around the containers opening;

wet etching the second insulative layer comprising silicon oxide material to expose the etch stop layer and the HSG polysilicon layer outside the containers;

after wet etching the second insulative layer comprising silicon oxide material removing the barrier layer to expose interior surfaces of the HSG polysilicon layer in the containers; and forming a silicon nitride layer over the HSG polysilicon layer after removing the barrier layer to expose interior surfaces of the HSG polysilicon layer, the silicon nitride layer formed in contact with the HSG polysilicon layer.

50. The method of claim 49, further comprising:

depositing a layer of dielectric material over the HSG Polysilicon layer in the containers;

and forming a top electrode over the deposited dielectric layer in the containers.

51. The method of claim 49, wherein the containers have a cross-sectional shape, in a top down view, selected from the group consisting of circular, square, rectangular, trapezoidal, triangular, oval, and rhomboidal shapes.

52. The method of claim 49, wherein the HSG polysilicon layer is formed to provide a cup-shaped structure for the bottom electrode.

53. The method of claim 49, wherein wet etching the second insulative layer comprises:

wet etching the second insulative layer to expose a portion of outside surface of the formed HSG polysilicon layer in the containers using a hydrofluoric acid (HF) solution for about 345 seconds.

* * * * *

UNITED STATES PATENT AND TRADEMARK OFFICE
CERTIFICATE OF CORRECTION

PATENT NO. : 6,794,245 B2
DATED : September 21, 2004
INVENTOR(S) : Zheng

It is certified that error appears in the above-identified patent and that said Letters Patent is hereby corrected as shown below:

Column 6,
Line 9, after "Tin" delete "layer".

Column 16,
Line 24, after "material" insert -- , --.
Line 45, delete "indluding" and insert -- including --, therefor.
Line 64, after "material" insert -- , --.

Column 17,
Line 26, delete "barrier layers" and insert -- Tin layer --, therefor.
Line 55, after "electrode" delete ",".

Column 18,
Line 6, after "material" insert -- , --.
Line 9, delete "removina" and insert -- removing --, therefor.
Line 28, delete "polysilicon" and insert -- silicon --, therefor.
Line 36, after "electrode" delete ",".
Line 55, after "material" insert -- , --.

Column 19,
Line 11, after "electrode" delete ",".
Line 30, delete "iinsulative" and insert -- insulative --, therefor.
Line 63, after "material" insert -- , --.

Column 20,
Line 6, after "using" insert -- a --.
Line 35, after "material" insert -- , --.
Line 38, delete "removina" and insert -- removing --, therefor.

Column 21,
Line 9, after "material" insert -- , --.
Line 44, after "and" delete "around".
Line 49, delete "coomprising" and insert -- comprising --, therefor.
Line 50, after "material" insert -- , --.

UNITED STATES PATENT AND TRADEMARK OFFICE
CERTIFICATE OF CORRECTION

PATENT NO. : 6,794,245 B2
DATED : September 21, 2004
INVENTOR(S) : Zheng

It is certified that error appears in the above-identified patent and that said Letters Patent is hereby corrected as shown below:

Column 22,
Line 28, after "and" delete "around".
Line 34, after "material" insert -- , --.

Signed and Sealed this

Tenth Day of May, 2005

JON W. DUDAS
*Director of the United States Patent and Trademark Office*